United States Patent
Ichikawa

(10) Patent No.: US 11,709,572 B2
(45) Date of Patent: Jul. 25, 2023

(54) ELECTROSTATIC-CAPACITIVE PROXIMITY DETECTING DEVICE AND METHOD FOR DETECTING POSITION OF TO-BE-DETECTED OBJECT

(71) Applicant: Alps Alpine Co., LTD, Tokyo (JP)

(72) Inventor: Teiichi Ichikawa, Fukushima (JP)

(73) Assignee: Alps Alpine Co., LTD., Tokyo (JP)

( * ) Notice: Subject to any disclaimer, the term of this patent is extended or adjusted under 35 U.S.C. 154(b) by 0 days.

(21) Appl. No.: 17/666,088

(22) Filed: Feb. 7, 2022

(65) Prior Publication Data

US 2022/0253180 A1 Aug. 11, 2022

(30) Foreign Application Priority Data

Feb. 8, 2021 (JP) .................................. 2021-018380
Nov. 26, 2021 (JP) .................................. 2021-191646

(51) Int. Cl.
*G06F 3/044* (2006.01)
*G06F 3/041* (2006.01)

(52) U.S. Cl.
CPC ........ *G06F 3/0446* (2019.05); *G06F 3/04166* (2019.05)

(58) Field of Classification Search
CPC . G06F 2203/04107; G06F 2203/04108; G06F 3/0416; G06F 3/04166; G06F 3/0443; G06F 3/0446
See application file for complete search history.

(56) References Cited

U.S. PATENT DOCUMENTS

| | | | |
|---|---|---|---|
| 2009/0187375 A1* | 7/2009 | Kinoshita | G06F 3/04166 702/158 |
| 2012/0286802 A1 | 11/2012 | Kaltner | |
| 2017/0160863 A1* | 6/2017 | Suzuki | G06F 3/0443 |
| 2020/0050348 A1 | 2/2020 | Yabuki | |

FOREIGN PATENT DOCUMENTS

| | | |
|---|---|---|
| BE | 1 021 630 B1 | 12/2015 |
| GB | 2 394 775 A | 5/2004 |
| JP | 2011-85549 | 4/2011 |

OTHER PUBLICATIONS

European Search Report from corresponding European Application No. 22154469.5, dated Jun. 13, 2022, 8 pp.

* cited by examiner

*Primary Examiner* — Robin J Mishler
(74) *Attorney, Agent, or Firm* — Crowell & Moring, L.L.P.

(57) ABSTRACT

An electrostatic-capacitive proximity detecting device includes an electrode unit including a plurality of electrodes linearly arranged along one direction; an electrostatic capacitance detector that drives the electrodes in a time division manner and detects detection values corresponding to electrostatic capacitances between a to-be-detected object and the respective electrodes; and a position detector that detects a position of the to-be-detected object in the one direction, based on arrangement positions of the respective electrodes in the one direction and a bias in magnitudes of the detection values detected for the respective electrodes by the electrostatic capacitance detector.

13 Claims, 21 Drawing Sheets

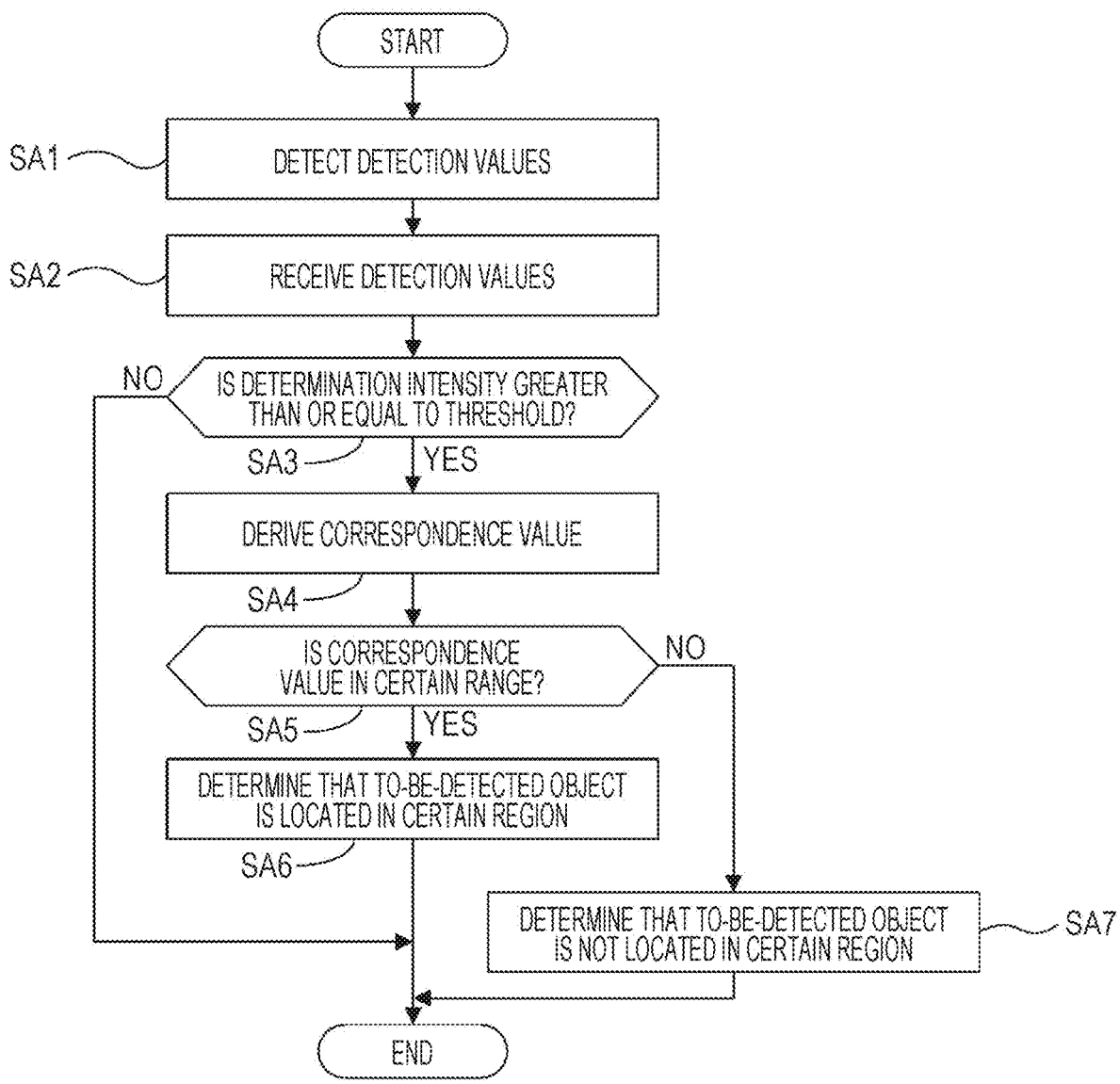

ELECTROSTATIC-CAPACITIVE PROXIMITY DETECTING DEVICE AND METHOD FOR DETECTING POSITION OF TO-BE-DETECTED OBJECT

RELATED APPLICATION

The present application claims priority to Japanese Patent Application Number 2021-191646, filed Nov. 26, 2021, and Japanese Patent Application Number 2021-018380, filed Feb. 8, 2021, the entirety of which are hereby incorporated by reference.

BACKGROUND

1. Field of the Invention

The present invention relates to an electrostatic-capacitive proximity detecting device and a method for detecting the position of a to-be-detected object. In particular, the present invention is preferably used for an electrostatic-capacitive proximity detecting device that detects the position of a to-be-detected object by using an electrostatic capacitance between an electrode and a to-be-detected object and a method for detecting the position of a to-be-detected object, the detection being performed by an electrostatic-capacitive proximity detecting device.

2. Description of the Related Art

Heretofore, electrostatic-capacitive proximity detecting devices (also called electrostatic capacitance (type) proximity sensors) have been known that detect proximity of a to-be-detected object based on an electrostatic capacitance that occurs between an electrode and a to-be-detected object spaced from the electrode. With regard to the electrostatic-capacitive proximity detecting devices, JP 2011-085549 A discloses a technology in which a pair of electrodes that oppose each other in one direction (an x-axis direction or a y-axis direction) are caused to function as detection electrodes, and the position of the to-be-detected object in the direction is detected based on a difference between output values (electrostatic capacitances) of the pair of detection electrodes.

Electrostatic-capacitive proximity detecting devices each detect proximity of a to-be-detected object by utilizing an electric field that extends spherically from an electrode (thus, it is difficult to make the electric field have directivity). Thus, when no measures are taken, even in a case in which the to-be-detected object is located at different places, electrostatic capacitances (changes in electrostatic capacitances) having equivalent magnitudes are detected as long as the distances from the electrode are the same. The electrostatic-capacitive proximity detecting devices, therefore, have a characteristic of having difficulty in determining whether or not the to-be-detected object is located in a predetermined specific region. Accordingly, there are demands for allowing a determination as to whether or not a to-be-detected object is in a predetermined specific region to be made with as high accuracy as possible.

SUMMARY

The present invention has been made in view of the foregoing, and an object thereof is to make it possible to highly accurately determine whether or not a to-be-detected object is located in a predetermined specific region.

In order to overcome the problem described above, according to the present disclosure, an electrode unit including a plurality of electrodes linearly arranged along one direction is provided, the electrodes are driven in a time division manner, detection values corresponding to electrostatic capacitances between a to-be-detected object and the respective electrodes are detected, and a position of the to-be-detected object in the direction is detected based on arrangement positions of the respective electrodes in the direction and a bias in magnitudes of the detection values detected for the respective electrodes.

When electrodes are linearly arranged along one direction, a bias corresponding to a bias in the spacing distances between the to-be-detected object and the respective electrodes occurs in the magnitudes of detection values (electrostatic capacitances) detected at the electrodes, in accordance with the position of the to-be-detected object in the direction. The bias in the magnitudes of the detection values detected at the electrodes and the bias in the spacing distances between the to-be-detected object and the electrodes are correlated with each other. That is, the detection values detected at the electrodes have a characteristic that a bias occurs in a form corresponding to the position of the to-be-detected object in one direction, and this characteristic can be used to highly accurately determine the position of the to-be-detected object in the direction. According to the present disclosure, since the position of the to-be-detected object in one detection is detected based on the arrangement positions of the electrodes arranged in the direction and a bias in the magnitudes of the detection values for the respective electrodes, the position of the to-be-detected object in the direction can be detected highly accurately. In addition, based on such a highly accurately detected position of the to-be-detected object, it is possible to highly accurately determine whether or not the to-be-detected object is located in a predetermined specific region.

BRIEF DESCRIPTION OF THE DRAWINGS

FIG. 9 is a flowchart illustrating an operation example of the electrostatic-capacitive proximity detecting device according to the first embodiment;

DETAILED DESCRIPTION OF THE PREFERRED EMBODIMENTS

First Embodiment

Figure 1:
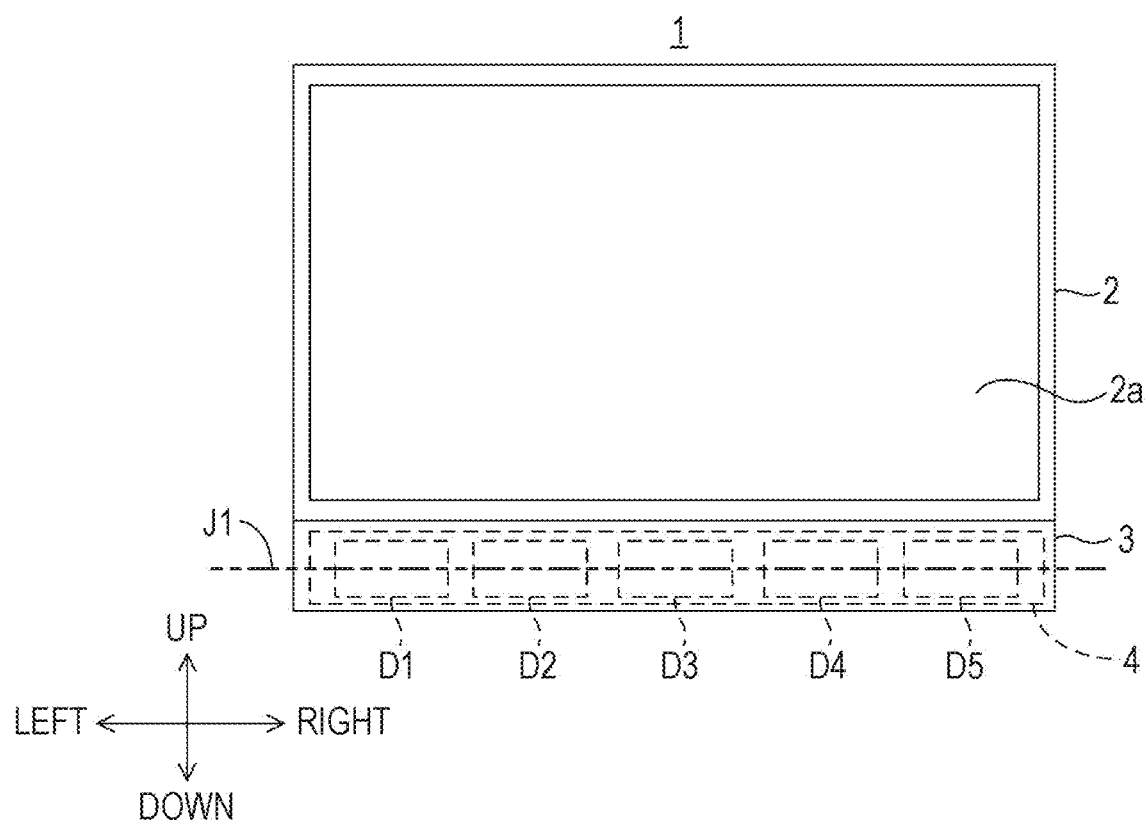
FIG. 1 is a front view of an in-vehicle apparatus according to a first embodiment.

A first embodiment of the present disclosure will be described below with reference to the accompanying drawings. FIG. 1 is a simplified front view schematically illustrating an in-vehicle apparatus 1 according to the present embodiment. The in-vehicle apparatus 1 is provided in a vehicle and is, for example, a car navigation system provided at a middle portion of an instrumental panel in the vehicle. As illustrated in FIG. 1, the in-vehicle apparatus 1 includes a display panel 2 and an electrostatic-capacitive proximity detecting device 3. The display panel 2 is a device that displays video on a display screen 2a. The display panel 2 is, for example, a display device, such as a liquid-crystal display or an organic electroluminescent (EL) panel. The display panel 2 may be implemented by a touch panel.

As illustrated in FIG. 1, the electrostatic-capacitive proximity detecting device 3 includes an electrode unit 4. In the description below, "upward", "above", or "up" means an upward direction when the electrode unit 4 is viewed from the front, unless otherwise particularly stated. Similarly, "downward", "below", or "down" means a downward direction when the electrode unit 4 is viewed from the front, "rightward", "right direction", or "right" means a rightward direction when the electrode unit 4 is viewed from the front, and "leftward", "left direction", or "left" refers to a leftward direction when the electrode unit 4 is viewed from the front. Also, a frontward direction when the electrode unit 4 is viewed from the front is referred to as "front-facing", "frontward", "front", and a backward direction when the electrode unit 4 is viewed from the front is referred to as "back-facing", "backward", or "back" (also see FIG. 2 for "front-facing" and "back-facing").

The electrode unit 4 includes five electrodes D1 to D5 linearly arranged along a left-and-right direction. In the present embodiment, the left-and-right direction corresponds to "one direction.". The electrodes D1 to D5 are herein referred to as "electrodes D" when they are not distinguished therebetween.

Figure 2:
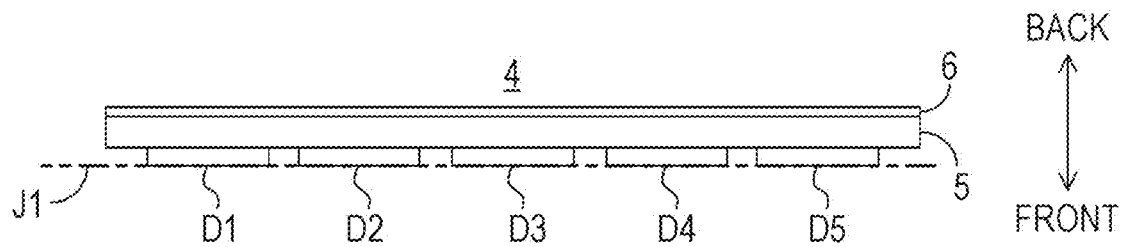
FIG. 2 is a plan view of an electrode unit according to the first embodiment.

FIG. 2 is a simplified top view of the configuration of the electrode unit 4. As illustrated in FIG. 2, the electrode unit 4 includes a substrate 5. The five electrodes D1 to D5 whose surface areas are the same are disposed on a surface (a front-facing surface) of the substrate 5, and are linearly arranged at regular intervals in the left-and-right direction (see also FIG. 1). A back surface of the substrate 5 is provided with a shield electrode 6, so that an object at the back surface of the substrate 5 does not affect electrostatic capacitances of the electrodes D1 to D5.

Figure 3:
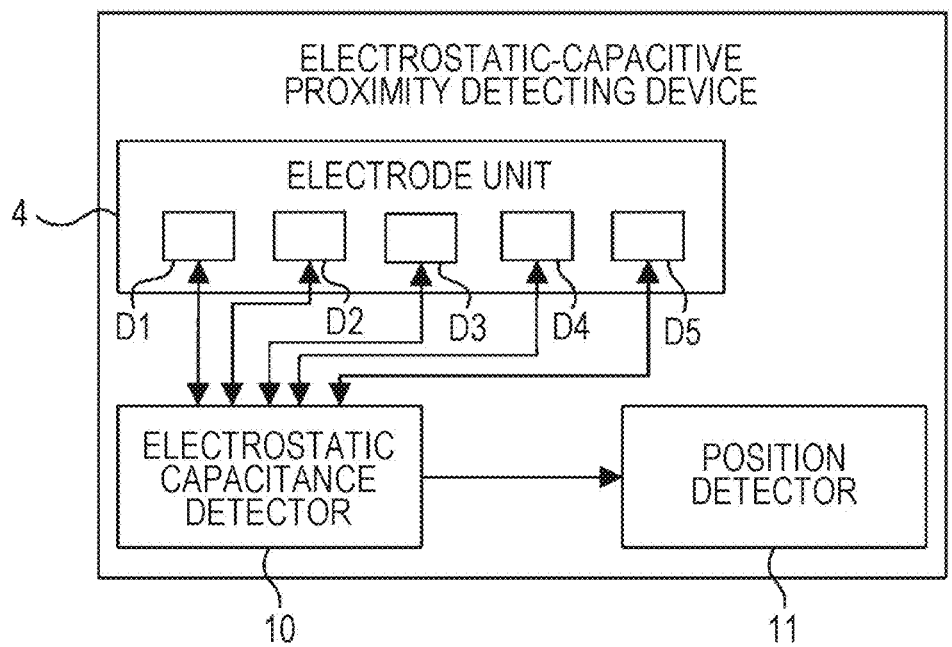
FIG. 3 is a block diagram illustrating a functional configuration example of an electrostatic-capacitive proximity detecting device according to the first embodiment.

FIG. 3 is a block diagram illustrating a functional configuration example of the electrostatic-capacitive proximity detecting device 3. The electrostatic-capacitive proximity detecting device 3 detects that a to-be-detected object (e.g., a hand of a person) in a vehicle is in close proximity to the in-vehicle apparatus 1. As illustrated in FIG. 3, the electrostatic-capacitive proximity detecting device 3 includes an electrostatic capacitance detector 10 and a position detector 11 as functional blocks. The functional blocks 10 and 11 can be implemented by any of hardware, a digital signal processor (DSP), and software. For example, when the functional blocks 10 and 11 are implemented by software, they are, in practice, configured to include a central processing unit (CPU), a random-access memory (RAM), a read-only memory (ROM), and so on of a computer and are realized by operation of a program stored in a storage medium, such as the RAM, the ROM, a hard disk, or a semiconductor memory. The same applies to functional blocks in other embodiments.

Figure 4:
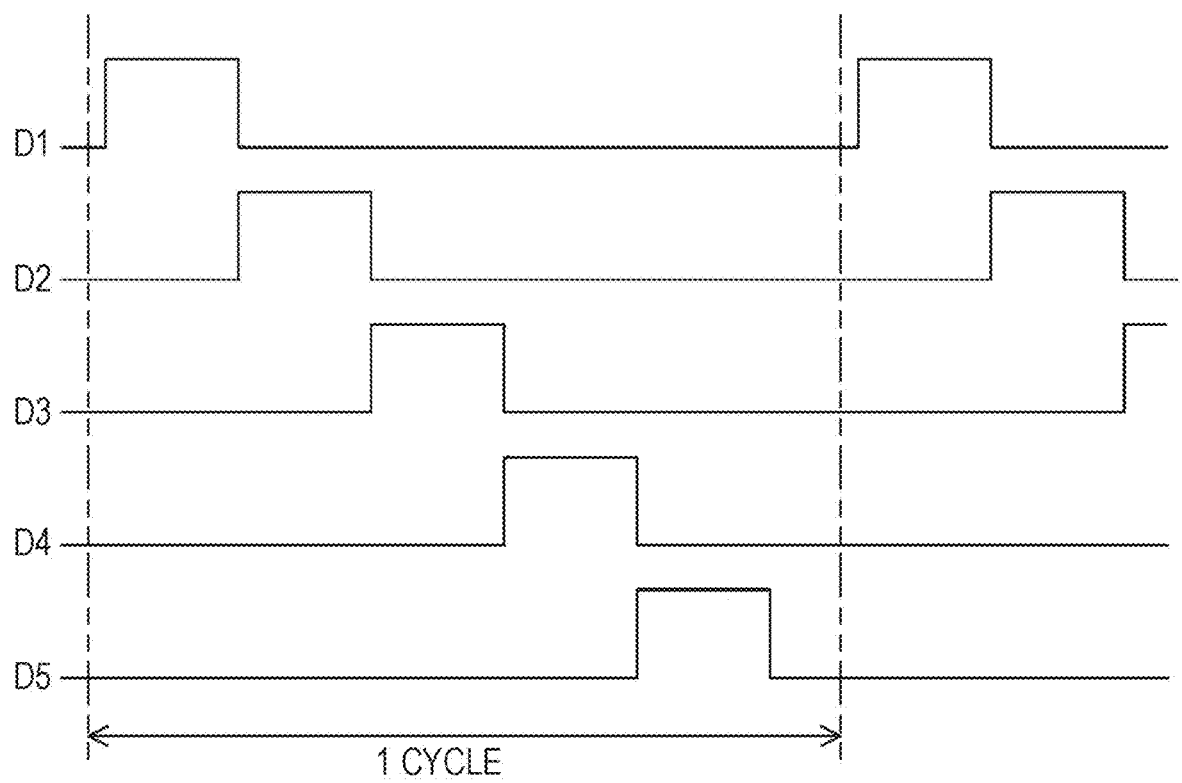
FIG. 4 is a timing chart illustrating timings at which electrodes are driven.

The electrostatic capacitance detector 10 drives the electrodes D1 to D5 in a time division manner and detects electrostatic capacitances of the respective electrodes D1 to D5. Driving the electrodes D means that drive voltages are applied to the electrodes D to form electric fields, respectively. In the present embodiment, the electrostatic capacitance detector 10 applies drive voltages having the same magnitude to the respective electrodes D1 to D5. FIG. 4 is a timing chart illustrating timings at which the electrodes D1 to D5 are driven. As illustrated in FIG. 4, the electrostatic capacitance detector 10 drives the electrodes D1, D2, D3, D4, and D5 in one cycle while shifting the electrodes D in the order. The electrostatic capacitance detector 10 repeatedly executes the cycle.

In response to driving of one of the electrodes D, the electrostatic capacitance detector 10 detects a detection value for the electrostatic capacitance of the electrode D and outputs the detection value to the position detector 11. As a result, in each cycle, the electrostatic capacitance detector 10 outputs the detection values for the electrodes D1 to D5 to the position detector 11.

In each cycle, the position detector 11 detects the position of the to-be-detected object in the left-and-right direction, based on the detection values for the respective electrodes D1 to D5, the detection values being detected by the electrostatic capacitance detector 10, and determines whether or not the to-be-detected object is located in a predetermined region in the left-and-right direction. Processing in the position detector 11 will be described in detail below.

Figure 5:
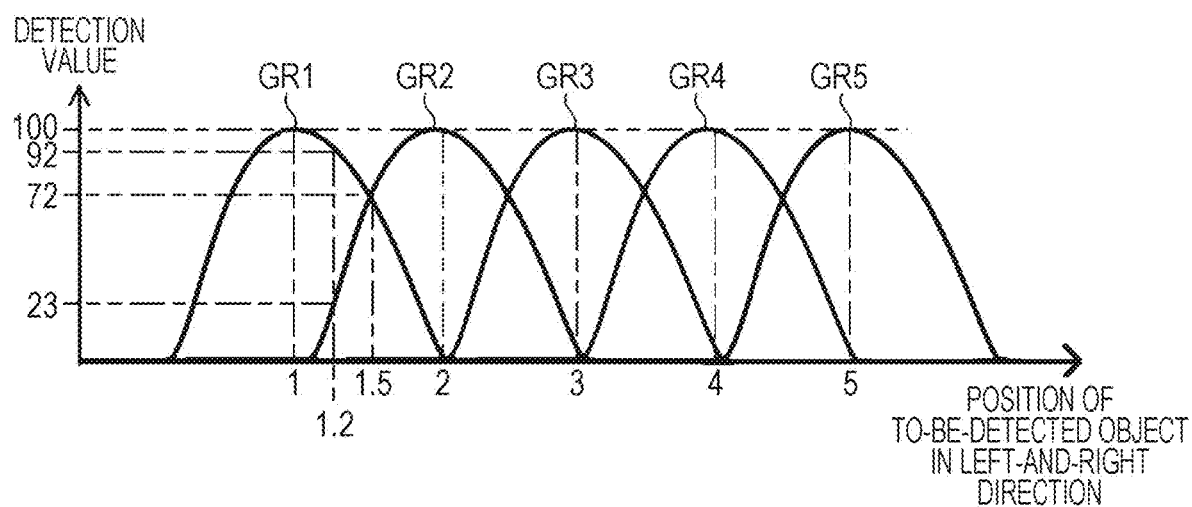
FIG. 5 is a graph illustrating relationships between the position of a to-be-detected object in a left-and-right direction and detection values for the electrodes.
Figure 6:
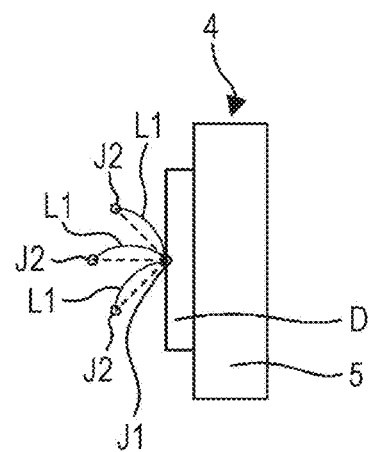
FIG. 6 is a right side view of the electrode unit.

FIG. 5 is a graph illustrating relationships between the position of the to-be-detected object and the detection values for the respective electrodes D1 to D5 when the to-be-detected object moves in the left-and-right direction while maintaining a certain distance from the electrode unit 4. FIG. 6 is a right side view of the electrode unit 4. The expression "to-be-detected object moves in the left-and-right direction while maintaining a certain distance from the electrode unit 4" means that, when a virtual axis J1 that passes through centers of surfaces of the respective electrodes D1 to D5 is set as illustrated in FIG. 6 (see also FIGS. 1 and 2 for the axis J1), the to-be-detected object moves on an axis J2 that extends parallel to the axis J1 and that is spaced from the axis J1 by a certain distance L1. In the present embodiment, the axis J2 is assumed to be located at a place that is close to the electrode unit 4 to a degree that a correspondence value N (described below) derived for the to-be-detected object and an actual coordinate value of the to-be-detected object are approximately equal to each other. The correspondence value N is described later in the present embodiment, and a case in which the correspondence value N and the actual coordinate value are not approximately equal to each other is detailed in a fourth embodiment. Axes, such as the axis J2, that extend parallel to the axis J1 are herein referred to as "virtual movement axes".

In the present embodiment, it is assumed that coordinates are defined on the axis J1, and it is also assumed that a coordinate value of the electrode D1 (this coordinate value is the value of the coordinate of a center portion of the surface of the electrode D1, and the same applies to the other electrodes D) is "1", a coordinate value of the electrode D2 is "2", a coordinate value of the electrode D3 is "3", a coordinate value of the electrode D4 is "4", and a coordinate value of the electrode D5 is "5". The coordinate value of each electrode D can be said to be a value obtained by representing the position of the electrode D relative to a reference position by using a coordinate. In addition, coordinates are also defined on the virtual movement axes (including the virtual movement axis J2) parallel to the axis J1 so that points that oppose each other on the respective axes have the same values. That is, the coordinate value of one point on the axis J1 and the coordinate value of a point that exists on a virtual movement axis and that opposes that point on the axis J1 are the same. Each coordinate value indicates a position in the left-and-right direction.

The horizontal axis in the graph in FIG. 5 represents the coordinates on the virtual movement axis J2 (these coordinates are equal to the coordinates on the axis J1), and the vertical axis in the graph represents the magnitude of the detection value detected for each electrode D. In FIG. 5, GR1 represents a graph of the electrode D1, GR2 represents a graph of the electrode D2, GR3 represents a graph of the electrode D3, GR4 represents a graph of the electrode D4, and GR5 represents a graph of the electrode D5.

As is apparent from FIG. 5, the graph for each electrode D is a mountain-like bilaterally symmetric graph having its peak at the center of the electrode D. In the present embodiment, the detection value at the peak is assumed to be 100, for convenience of description. This is because, when the distance between the electrode D and the to-be-detected object is the smallest, the electrostatic capacitance of the electrode D becomes the largest, and as the to-be-detected object gets farther from the electrode D, the electrostatic capacitance decreases according to the distance (the magnitude of the electrostatic capacitance is inversely proportional to the distance between the electrode D and the to-be-detected object, as is known). The shapes of the graphs for the electrodes D are the same. This is because, in the present embodiment, the surface areas of the electrodes D are the same, the drive voltages for the electrodes D are the same, and the forms of the electric fields formed by the respective electrodes D are the same.

Now, attention is given to the coordinate value "1" in the graph in FIG. 5. When the to-be-detected object is located at a place of the coordinate value "1", the detection value for the electrode D1 is 100, and the detection values for the electrodes D2 to D5 are minute values that are close to 0 (the minute values are herein represented as "0", for the sake of convenience). This indicates that a bias in the spacing distances between the to-be-detected object and the respective electrodes D1 in such a manner that the spacing distance for the electrode D is the smallest and increases as the to-be-detected object gets closer from the electrode D2 to the electrode D5, and owing to the bias, a bias occurs in the detection values for the electrode D, as represented by D1:D2:D3:D4:D5="100":"0":"0":"0":"0".

Next, attention is given to a coordinate value "1.2". When the to-be-detected object is located at a place of the coordinate value "1.2", the detection value for the electrode D1 is "92", the detection value for the electrode D2 is "23", and the detection values for the electrodes D3 to D5 are minute values close to "0" (the minute values are represented as "0", for the sake of convenience). This indicates that a bias occurs in the spacing distances between the to-be-detected object and the respective electrodes D in such a manner that the spacing distance for the electrode D1 is the smallest and increases as the to-be-detected object gets closer from the electrode D2 toward the electrode D5, and owing to the bias, a bias occurs in the detection values for the electrodes D, as represented by D1:D2:D3:D4:D5="92":"23":"0":"0":"0".

Next, attention is given to a coordinate value "1.5". When the to-be-detected object is located at a place of the coordinate value "1.5", the detection value for the electrode D1 is "72", the detection value for the electrode D2 is "72", and the detection values for the electrodes D3 to D5 are minute values close to "0" (the minute values are represented as "0", for the sake of convenience). This indicates that a bias occurs in the spacing distances between the to-be-detected object and the respective electrodes D in such a manner that the spacing distances are equivalent for the electrodes D1 and D2, and the spacing distance increase as the to-be-detected object gets closer from the electrode D3 to the electrode D5, and owing to the bias, a bias occurs in the detection values for the electrodes D, as represented by D1:D2:D3:D4:D5="72":"72":"0":"0":"0".

As described above, the electrode unit 4 according to the present embodiment has a configuration in which the plurality (five) of electrodes D is linearly arranged along the left-and-right direction, and in this configuration, depending on the position of the to-be-detected object in the left-and-right direction, a bias corresponding to a bias in the spacing distances between the to-be-detected object and the respective electrodes D occurs in the magnitudes of the detection values detected for the respective electrodes D. The bias in the magnitudes of the detection values detected for the respective electrodes D and the bias in the spacing distances between the to-be-detected object and the respective electrodes D are correlated with each other. That is, the detection values detected for the electrodes D have a characteristic that a bias occurs in a form corresponding to the position of the to-be-detected object in the left-and-right direction. This characteristic appears in a range in which significant detection values are detected regardless of the distance of the to-be-detected object from the electrode unit 4. The position detector 11 according to the present embodiment performs processing below utilizing the above-described characteristic, to highly accurately detect the position of the to-be-detected object in the left-and-right direction.

Processing that the position detector 11 executes in one cycle will be detailed below in detail. The position detector 11 receives the detection values for the electrodes D1 to D5. The position detector 11 then derives a determination intensity, based on the detection values for the electrodes D1 to D5, and determines whether or not the determination intensity is greater than or equal to a threshold. The "determination intensity" refers to an overall intensity of the detection values for the electrodes D1 to D5. The determination intensity is, for example, the largest detection value of the detection values for the electrodes D1 to D5, a total value of the detection values for the electrodes D1 to D5, or an average value (or a value of other statistical calculation) of the detection values for the electrodes D1 to D5. The closer the to-be-detected object is to the electrode unit 4, the larger the determination intensity is, and conversely, the farther the to-be-detected object is from the electrode unit 4, the smaller the determination intensity is. Thus, the determination intensity can be used as an indication value indicating to what degree the to-be-detected object is spaced from the electrode unit 4.

The determination as to whether or not the determination intensity is greater than or equal to the threshold is made in order to determine whether or not the to-be-detected object comes close to the electrode unit 4 to a degree that the position of the to-be-detected object needs to be detected. In the present embodiment, when the determination intensity is greater than or equal to the threshold, the position detector 11 detects the position of the to-be-detected object (specifically, derives the correspondence value N, which is described below), and when the determination intensity falls below the threshold, the position detector 11 does not detect the position of the to-be-detected object. A region (a three-dimensional region) in which the determination intensity is greater than or equal to the threshold is hereinafter referred to as a "detection target region". Only when the to-be-detected object is located in the detection target region, the position detector 11 detects the position of the to-be-detected object.

When the determination intensity falls below the threshold, the position detector 11 ends the processing performed in one cycle. In this case, the correspondence value N, which is described below, is not derived. On the other hand, when the determination intensity is greater than or equal to the threshold, the position detector 11 derives the correspondence value N by using calculation expression S1:

$$N=(B1*E1+B2*E2+B3*E3+B4*E4+B5*E5)/(E1+E2+E3+E4+E5)$$

where B1 is the coordinate value ("1" in the present embodiment) of the electrode D1, B2, B3, B4, and B5 are coordinate values of the electrodes D2, D3, D4, and D5, respectively, and E1, E2, E3, E4, and E5 are detection values for the electrodes D1, D2, D3, D4, and D5, respectively.

The calculation expression S1 is an expression for deriving the correspondence value N by performing weighted averaging in which the detection values for the respective electrodes D are weights, and the positions of the electrodes D in the left-and-right direction are variables. The correspondence value N can be said to be a value representing the position of the to-be-detected object in the left-and-right direction, the value being derived by reflecting the bias in the detection values for the electrodes D into the positions (the coordinate values) of the electrodes D in the left-and-right direction. Since the detection values detected for the respective electrodes D have a characteristic that a bias occurs in a form corresponding to the position of the to-be-detected object in the left-and-right direction, as described above, deriving the correspondence value (the position of the to-be-detected object in the left-and-right direction) by using the calculation expression S1 allows the position of the to-be-detected object in the left-and-right direction to be detected with high accuracy. That is, by using the calculation expression S1, the position detector 11 derives the correspondence value N to thereby highly accurately detect the position of the to-be-detected object in the left-and-right direction.

Figure 7A:
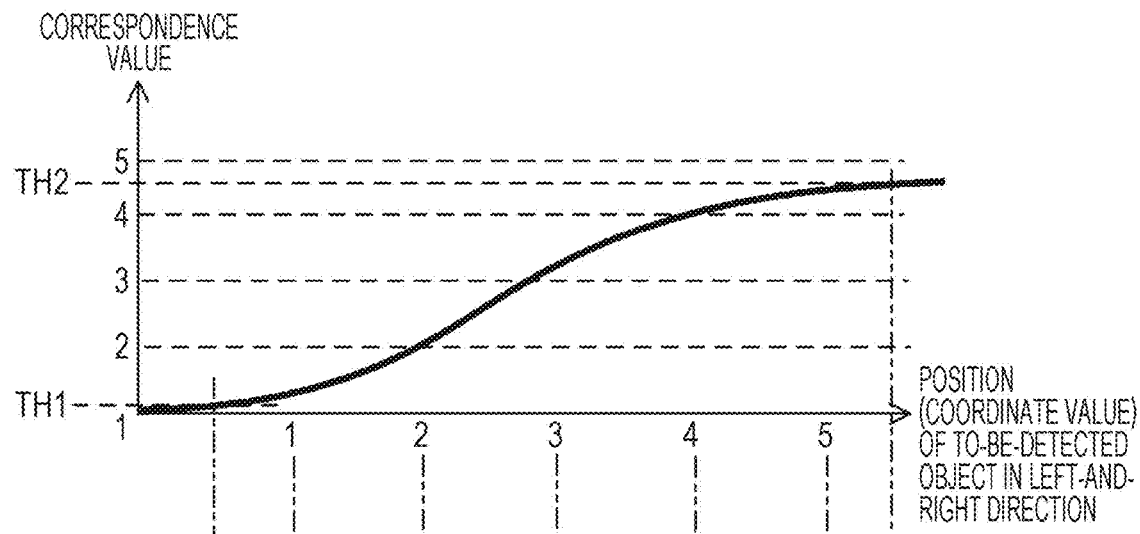
FIGS. 7A and 7B illustrate relationships between the position of the to-be-detected object in the left-and-right direction and a correspondence value.
Figure 7B:
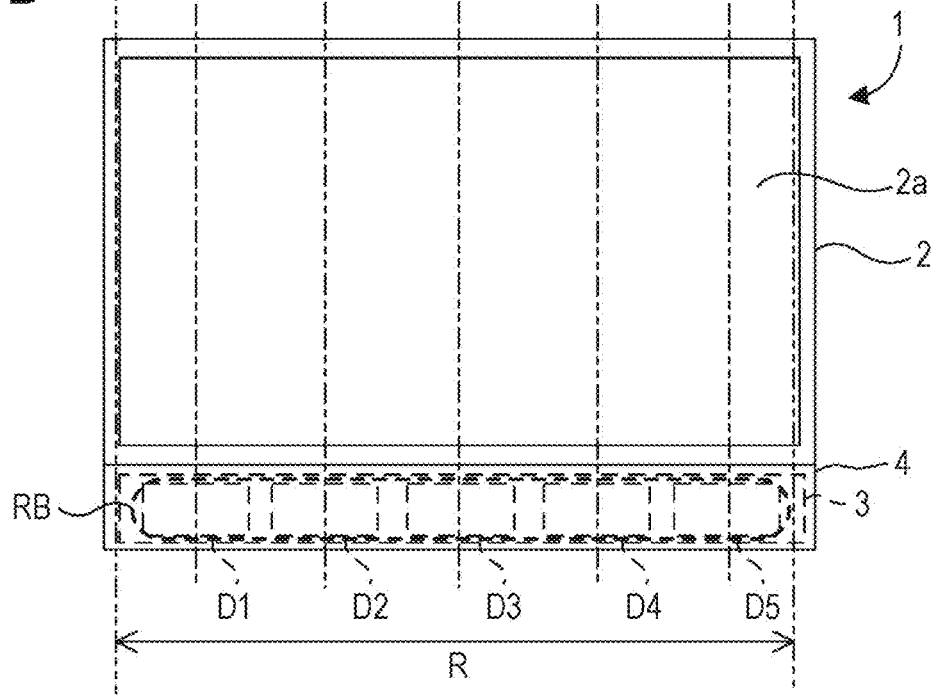

FIG. 7A is a graph illustrating relationships between the position of the to-be-detected object and the correspondence value N when the to-be-detected object moves on the virtual movement axis J2 in the left-and-right direction. In the graph in FIG. 7A, the horizontal axis represents the coordinates on the virtual movement axis J2 (the coordinates are equal to the coordinates on the axis J1), and the vertical axis represents the correspondence value N. That is, the graph in FIG. 7A indicates transition of the correspondence value N when the position of the to-be-detected object moves, the correspondence value N being derived by the position detector 11. FIG. 7B is a view obtained by rendering a front view of the in-vehicle apparatus 1 at a position associated with the horizontal axis of the graph in FIG. 7A.

FIGS. 7A and 7B show that the correspondence value N is approximately equal to the coordinate value of the position of the to-be-detected object in the left-and-right direction, and the position of the to-be-detected object is detected highly accurately (the position of the to-be-detected object which is indicated by the correspondence value N corresponds to the position of the actual to-be-detected object).

As described above, the correspondence value N is a value representing the position of the position detector 11 in the left-and-right direction, and in the present embodiment, the position detector 11 detects the position of the to-be-detected object in the left-and-right direction by deriving the correspondence value N. As described above, the position detector 11 according to the present embodiment highly accurately detects the position of the to-be-detected object in the left-and-right direction. By utilizing this function, the position detector 11 highly accurately determines whether or not the to-be-detected object is located in a predetermined specific region. Processing that the position detector 11 executes by using the correspondence value N will be described below by way of example.

First Example

First, a first example will be described. In FIG. 7B, in this example, a region R directly in front of the in-vehicle apparatus 1 in the left-and-right direction is a valid region, and a region to the left of the region R and a region to the right of the region R are invalid regions. The valid region is a region on which the position detector 11 makes a valid determination, when the to-be-detected object is located in the valid region. For example, when the in-vehicle apparatus 1 makes some type of query and detects that the to-be-detected object is located in the valid region (a case in which a person in the vehicle places his or her hand in the valid region is envisaged) within a predetermined time, the position detector 11 makes the valid determination, and correspondingly, the in-vehicle apparatus 1 performs a predetermined operation. In this case, when the to-be-detected object is not located in the valid region, the valid determination is not made, and the predetermined operation is not performed.

A person in the vehicle placing a to-be-detected object in the valid region (e.g., placing his or her hand therein) so as to cause the position detector 11 to make a valid determination is hereinafter referred to as a "contactless input". In the present embodiment, for the contactless input, the person in the vehicle is notified in advance that the to-be-detected object is to be placed at a position close to the electrode unit 4 (a position that is directly in front of the electrode unit 4 and that is in close proximity to the electrode unit 4, such as a position in a region RB surrounded by a dashed line in FIG. 7B). The "position close to the electrode unit 4" means a position at which there is almost no deviation between the correspondence value N that is derived and the coordinate value of the actual to-be-detected object. The meaning of the "position close to the electrode unit 4" is defined considering that as the to-be-detected object gets farther from the electrode unit 4, the accuracy of the correspondence value N decreases, and a deviation occurs between the correspondence value N and the actual coordinate value, as will become apparent in the fourth embodiment below. The determination intensity may be adjusted so that the position detection is performed only when the to-be-detected object is sufficiently close to the electrode unit 4.

In this example, a threshold TH1 and a threshold TH2 are pre-set for the correspondence value N, as illustrated in FIG. 7A. The threshold TH1 is a value for the correspondence value N derived by the position detector 11 when the to-be-detected object is located at a left-side end portion of the region R, and the threshold TH2 is a value for the correspondence value N derived by the position detector 11 when the to-be-detected object is located at a right-side end portion of the region R. The thresholds TH1 are TH2 are appropriately set through prior testing or simulation. The position detector 11 executes processing below in each cycle.

That is, the position detector 11 derives the determination intensity, and when the determination intensity is greater than or equal to the threshold, the position detector 11 derives the correspondence value N by using the above-described method. Then, the position detector 11 determines whether or not the correspondence value N is in a range (a certain range) that is larger than or equal to the threshold TH1 and is smaller than or equal to the threshold TH2. When the correspondence value N is in the range that is larger than or equal to the threshold TH1 and is smaller than or equal to the threshold TH2, the position detector 11 determines that the to-be-detected object is located in the valid region (a certain region in the left-and-right direction), that is, makes the valid determination. On the other hand, when the correspondence value N is not in the valid region, the position detector 11 determines that the to-be-detected object is not located in the valid region (the certain region in the left-and-right direction), that is, does not make the valid determination.

In this example, the correspondence value N is a value representing the actual position of the to-be-detected object with high accuracy. Use of such a high-accuracy correspondence value N allows the position detector 11 to highly accurately determine whether or not the to-be-detected object is located in the valid region.

Second Example

Figure 8:
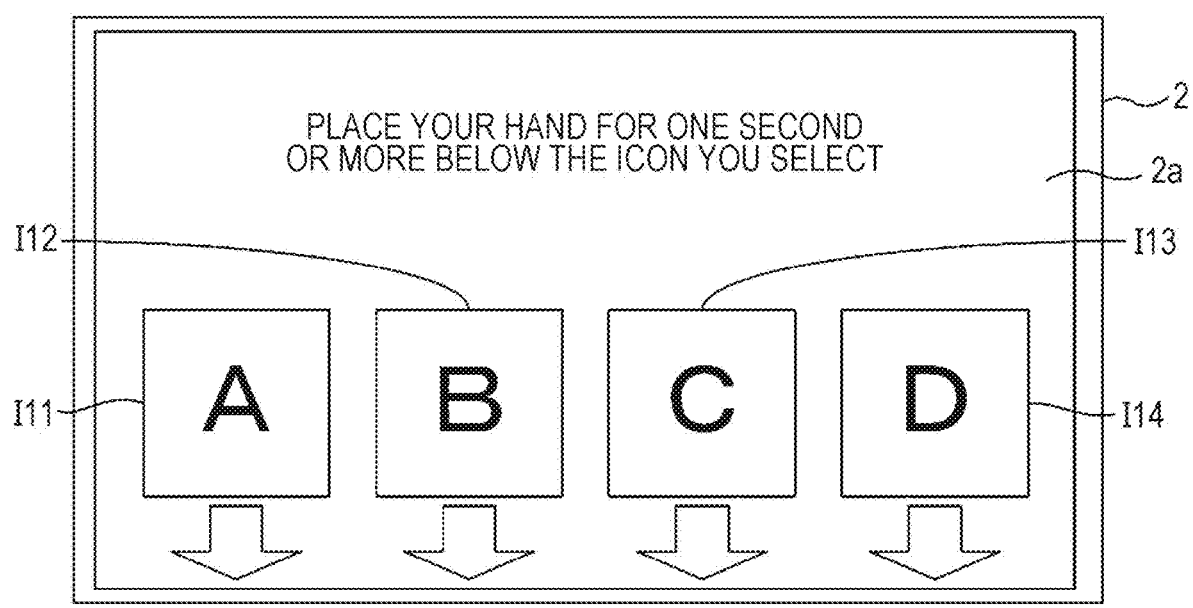
FIG. 8 illustrates one example of a screen displayed on a display panel.

Next, a second example will be described. In the second example, four rectangular icons I11 to I14, which are arranged in the left-and-right direction, are rendered on the display panel 2, as illustrated in FIG. 8. When the icons I11 to I14 are not distinguished therebetween, they are referred to as "icons I1". Character "A" is rendered on the icon I11, character "B" is rendered on the icon I12, character "C" is rendered on the icon I13, and character "D" is rendered on the icon I14. Also, information for prompting placing a hand for one second or more below the icon I1 to be selected is displayed at a position avoiding the icons I1 on the display panel 2.

In this example, the correspondence value N derived by the position detector 11 when the to-be-detected object is located at each of two opposite ends of a region corresponding to the icon I11 in the left-and-right direction is set in advance. Similarly, the correspondence value N corresponding to each of two opposite ends of the region corresponding to each of the icons I12 to I14 is also set in advance. The correspondence values N corresponding to two opposite ends of each icon I1 will be generally referred to hereinafter as "thresholds". The position detector 11 executes processing below in each cycle.

That is, the position detector 11 derives the correspondence value N by using the above-described method. When the correspondence value N is in a range (a certain range) between the thresholds for the two opposite ends of the region corresponding to the icon I11, the position detector 11 determines that the to-be-detected object is located in the region corresponding to the icon I11. Also, with respect to each of the icons I12 to I14, when the derived correspondence value N is in a range between the thresholds for the two opposite ends of the corresponding region, the position detector 11 determines that the to-be-detected object is located in the region.

When the position detector 11 determines that the correspondence value N is in the same region continuously in a predetermined number of cycles (the number of cycles corresponding to one second) or more, a control unit (not illustrated) in the in-vehicle apparatus 1 determines that a person in the vehicle selected the region, and executes corresponding processing.

In this example, the correspondence value N is a value indicating the position of the actual to-be-detected object with high accuracy. Use of such a high-accuracy correspondence value N allows the position detector 11 to highly accurately determine in which of the regions corresponding to the icons I12 to I14 the to-be-detected object is located.

Third Example

Next, a third example will be described. In the third example, the position detector 11 uses the correspondence value N to monitor whether or not the to-be-detected object moves in the detection target region in the left-and-right direction within a certain time by a certain amount or more, and upon detecting that the to-be-detected object has moved, the position detector 11 makes the valid determination. A specific description will be given below. Assume a state in which the position detector 11 has not derived the correspondence value N in a certain cycle (a state in which the determination intensity is smaller than the threshold). Thereafter, when the determination intensity becomes greater than or equal to the threshold in a next cycle, and the position detector 11 derives the correspondence value N, the position detector 11 monitors whether or not the amount of change in the correspondence value N becomes larger than or equal to a reference amount within a certain time. Upon detecting that the amount of change in the correspondence value N becomes larger than or equal to the reference amount within the certain time, the position detector 11 performs the valid determination. For example, it is assumed that the certain time is set to 3 seconds, and the reference amount is set to 3. Then, it is assumed that the position detector 11 does not derive the correspondence value N in a certain cycle and derives "1" in a next cycle as the correspondence value N. This means that the to-be-detected object is placed at a position in the left-and-right direction which corresponds to the coordinate value "1". Upon being triggered by the placement, the position detector 11 then monitors whether or not the correspondence value N becomes "4" or more within 3 seconds. The change in the correspondence value N from "1" to "4" means that the amount of change in the correspondence value N has reached "3" corresponding to the reference amount. Upon detecting that the correspondence value N becomes larger than or equal to "4" within 3 seconds (i.e., when the amount of change in the correspondence value N becomes larger than or equal to the reference amount), the position detector 11 makes the valid determination at the point in time when the correspondence value N reaches "4".

Next, operations of the electrostatic-capacitive proximity detecting device 3 will be described with reference to a flowchart. FIG. 9 is a flowchart illustrating operations that the electrostatic-capacitive proximity detecting device 3 executes in one cycle. In particular, FIG. 9 illustrates operations of the electrostatic-capacitive proximity detecting device 3 in the first example described above. As illustrated in FIG. 9, the electrostatic capacitance detector 10 drives the electrodes D1 to D5 in a time division manner and detects detection values corresponding to the electrostatic capacitances between the to-be-detected object and the respective electrodes D1 to D5 and outputs the detection values to the position detector 11 (step SA1).

The position detector 11 receives the detection values for the respective electrodes D from the electrostatic capacitance detector 10 (step SA2). The position detector 11 then derives the determination intensity and determines whether or not the determination intensity is greater than or equal to the threshold (step SA3). When the determination intensity is smaller than the threshold (NO in step SA3), the position detector 11 ends the processing. When the determination intensity is greater than or equal to the threshold (YES in step SA3), the position detector 11 derives the correspondence value N by using the calculation expression S1 noted above (step SA4). The position detector 11 then determines whether or not the correspondence value N is in a predetermined certain range (step SA5). When the correspondence value N is in the certain range (YES in step SA5), the position detector 11 determines that the to-be-detected object is located in the certain region in the left-and-right direction (step SA6). When the correspondence value N is not in the certain range (NO in step SA5), the position detector 11 determines that the to-be-detected object is not located in the certain region in the left-and-right direction (step SA7).

Second Embodiment

Figure 10A:
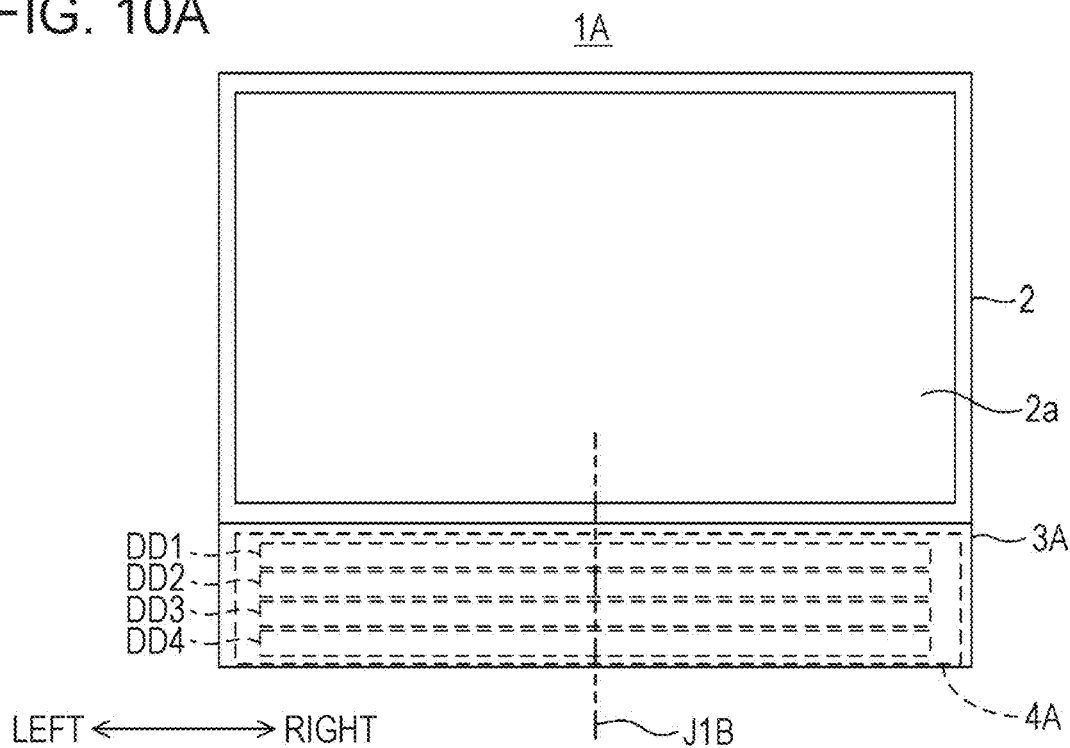
FIGS. 10A and 10B are a front view and a right side view, respectively, of an in-vehicle apparatus according to a second embodiment.
Figure 10B:
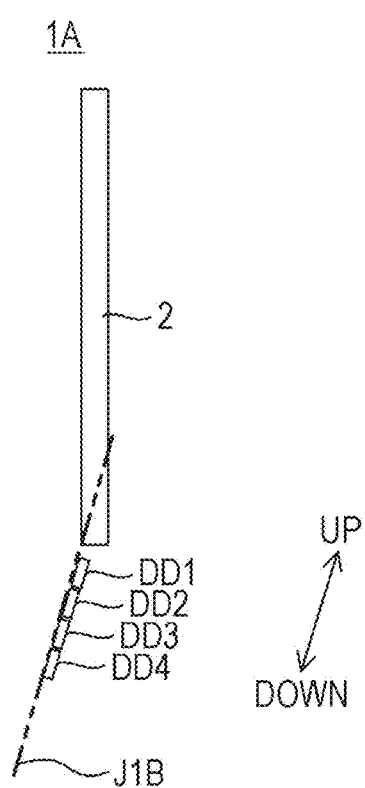

Next, a second embodiment will be described. FIG. 10A is a simplified front view schematically illustrating an in-vehicle apparatus 1A according to the present embodiment. In the second embodiment below, elements that are substantially the same as those in the first embodiment are denoted by the same reference numerals, and descriptions thereof are not given hereinafter. In the present embodiment, the in-vehicle apparatus 1A includes a display panel 2, which has a display screen 2a, and an electrostatic-capacitive proximity detecting device 3A, as illustrated in FIG. 10A. The electrostatic-capacitive proximity detecting device 3A includes an electrode unit 4A. The electrode unit 4A includes four electrodes DD1 to DD4. The electrodes DD1 to DD4 are referred to as "electrodes DD" when they are not distinguished therebetween. FIG. 10B is a simplified side view schematically illustrating a screen portion of the display panel 2 and the electrodes DD1 to DD4.

The surface areas of the electrodes DD1 to DD4 are the same, and the electrodes DD1 to DD4 are linearly arranged at regular intervals in an up-and-down direction. In FIGS. 10A and 10B, an axis J1B is a virtual axis that extends in the up-and-down direction through center points of surfaces of the respective electrodes DD1 to DD4. In the present embodiment, coordinates are defined on the axis J1B, and the positions (the positions of the centers of the surfaces) of the electrodes DD1 to DD4 are defined by coordinate values on the axis J1B.

Figure 11:
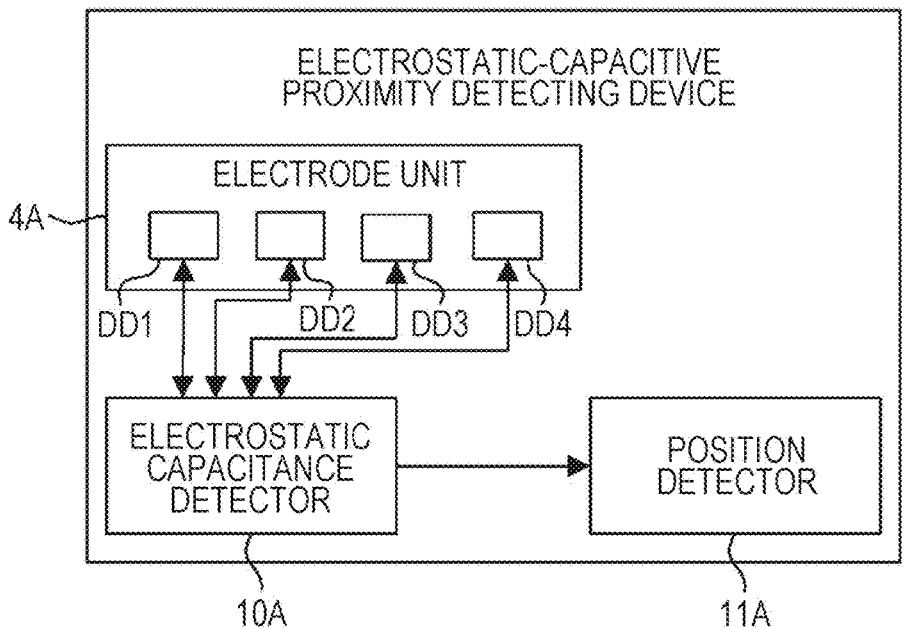
FIG. 11 is a block diagram illustrating a functional configuration example of an electrostatic-capacitive proximity detecting device according to the second embodiment.

FIG. 11 is a block diagram illustrating a functional configuration example of the electrostatic-capacitive proximity detecting device 3A according to the present embodiment. As illustrated in FIG. 11, the electrostatic-capacitive proximity detecting device 3A includes an electrostatic capacitance detector 10A, in place of the electrostatic capacitance detector 10 according to the first embodiment, and a position detector 11A, in place of the position detector 11 according to the first embodiment.

Figure 12:
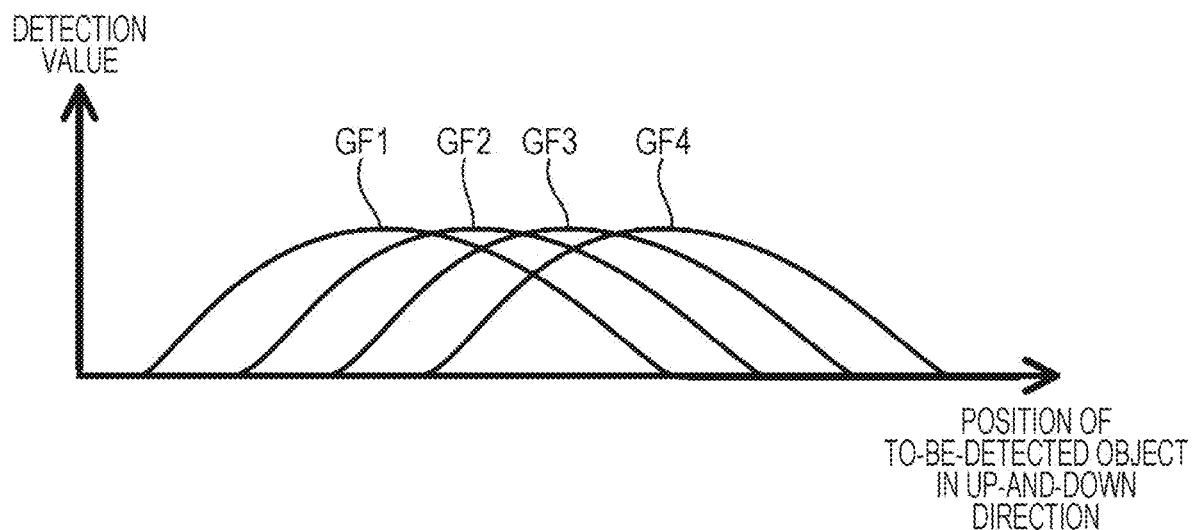
FIG. 12 is a graph illustrating relationships between the position of the to-be-detected object in an up-and-down direction and detection values for the electrodes.

FIG. 12 is a graph illustrating relationships between the position of the to-be-detected object and the detection values for the electrodes DD1 to DD4 when the to-be-detected object moves while maintaining a certain distance from the electrode unit 4A in the up-and-down direction. Reference numeral GF1 represents a graph for the electrode DD1, reference numeral GF2 represents a graph for the electrode DD2, reference numeral GF3 represents a graph for the electrode DD3, and reference numeral GF4 represents a graph for the electrode DD4.

It can be understood from FIG. 12 that, in the present embodiment, the amount of overlap of the graphs for the electrodes DD increases due to the physical shapes and the arrangement of the electrodes DD, compared with the first embodiment, but characteristics regarding the shapes of the graphs for the electrodes DD and the characteristics regarding the relationships between the graphs for the electrodes DD are similar to those in the first embodiment. Accordingly, use of the calculation expression S1 (where the number of variables is adjusted) makes it possible to highly accurately detect the position of the to-be-detected object in the up-and-down direction (i.e., derive the correspondence value N corresponding to the position of the actual to-be-detected object).

With a configuration described below, the electrostatic-capacitive proximity detecting device 3A executes processing below. That is, the electrostatic capacitance detector 10A drives the electrodes DD1 to DD4 in each cycle in a time division manner, detects the detection values for the electrodes DD1 to DD4, and outputs the detection values to the position detector 11A.

The position detector 11A executes processing below in each cycle. That is, the position detector 11A receives the detection values for the respective electrodes DD1 to DD4. The position detector 11A derives the correspondence value N by using the calculation expression S1 for deriving the correspondence value N by performing weighted averaging in which the detection values for the electrodes DD1 to DD4 are weights, and the positions of the electrodes DD1 to DD4 in the up-and-down direction are variables. The position detector 11A then determines whether or not the correspondence value N is in a predetermined certain range, and when the correspondence value N is in the certain range, the position detector 11A determines that the to-be-detected object is located in a certain region in the up-and-down direction. On the other hand, when the correspondence value N is not in the certain range, the position detector 11A determines that the to-be-detected object is not located in the certain region in the up-and-down direction.

According to the present embodiment, the position of the to-be-detected object in the up-and-down direction can be detected highly accurately, and further, a determination as to whether or not the to-be-detected object is located in the predetermined specific region can be made highly accurately, as in the first embodiment.

Third Embodiment

Figure 13A:
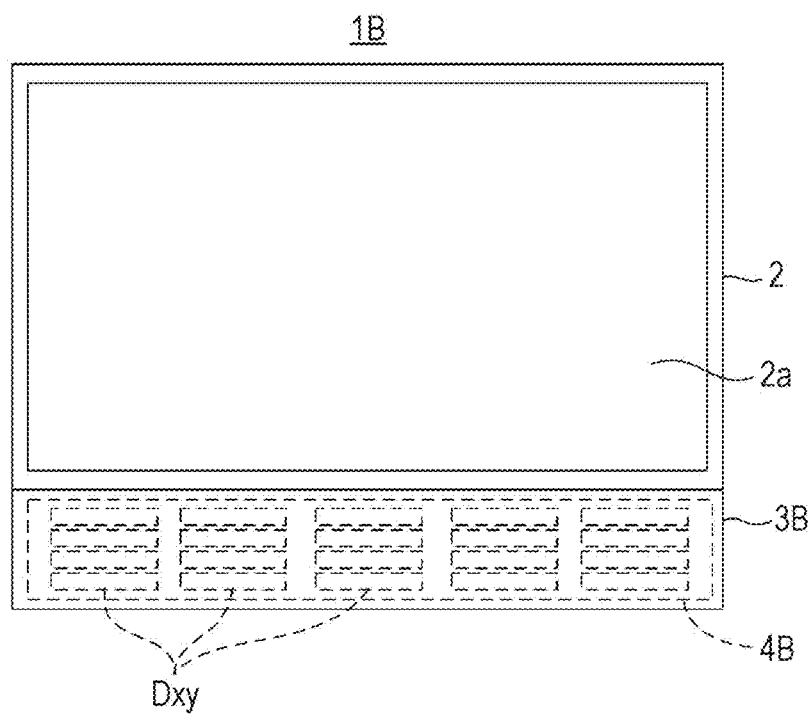
FIG. 13A is a front view of an in-vehicle apparatus according to a third embodiment.

Next, a third embodiment will be described. FIG. 13A is a simplified front view schematically illustrating an in-vehicle apparatus 1B according to the present embodiment. In the third embodiment described below, elements that are substantially the same as those in the first embodiment are denoted by the same reference numerals, and descriptions thereof are not given hereinafter.

Figure 13B:
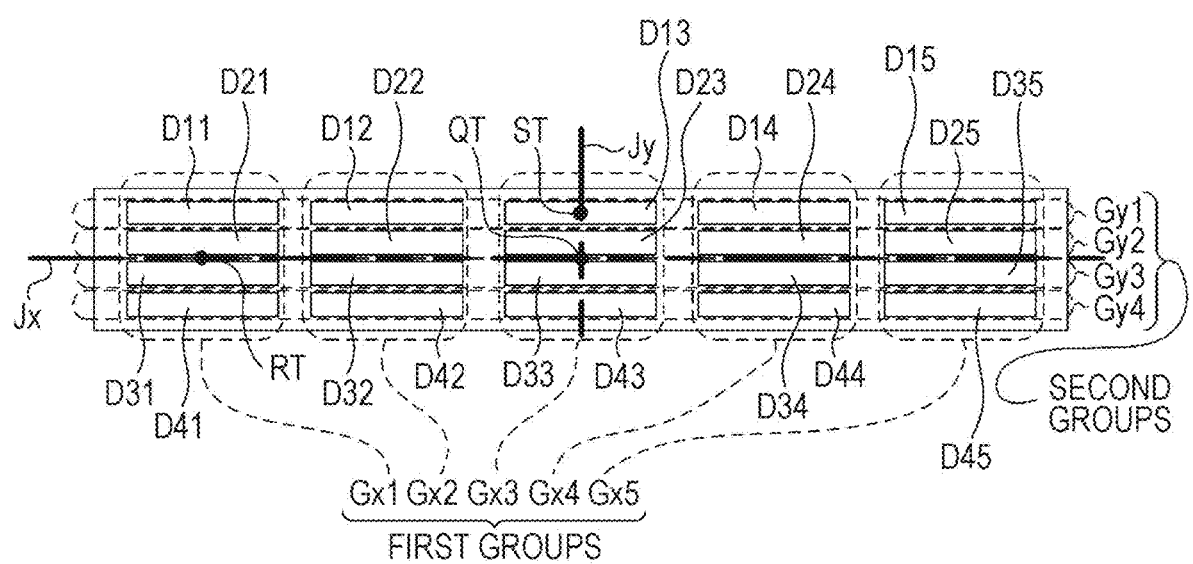
FIG. 13B is a partially enlarged view thereof.

In the present embodiment, the in-vehicle apparatus 1B includes a display screen 2a, which has a display panel 2, and an electrostatic-capacitive proximity detecting device 3B, as illustrated in FIG. 13A. The electrostatic-capacitive proximity detecting device 3B includes an electrode unit 4B. FIG. 13B is a view schematically illustrating a state of a surface of the electrode unit 4B in a form that is suitable for description thereof.

In the electrode unit 4B, a total of 20 electrodes D11 to D15, D21 to D25, D31 to D35, and D41 to D45, with four being linearly arranged along the up-and-down direction and five being linearly arranged along the left-and-right direction orthogonal to the up-and-down direction, are arrayed in a matrix. The electrodes D11 to D15, D21 to D25, D31 to D35, and D41 to D45 are hereinafter referred to as "electrodes Dxy" when they are not distinguished therebetween. The surface areas of the electrodes Dxy are the same. As illustrated in FIG. 13B, in the present embodiment, coordinates (hereinafter referred to as "y-axis coordinates", for the sake of convenience) are assumed to be defined on a virtual axis Jy that extends in the up-and-down direction through a center point QT of a region where the electrodes Dxy are arranged, and also coordinates (hereinafter referred to as "x-axis coordinates", for the sake of convenience) are assumed to be defined on a virtual axis Jx that extends in the left-and-right direction through the center point QT.

Figure 14:
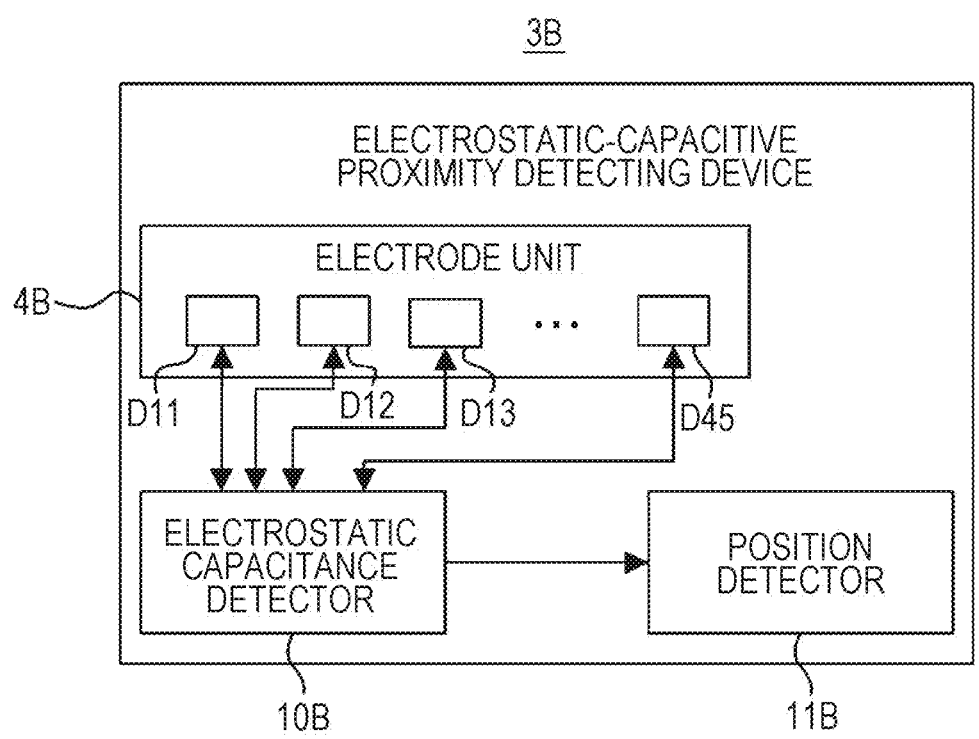
FIG. 14 is a block diagram illustrating a functional configuration example of an electrostatic-capacitive proximity detecting device according to the third embodiment.

FIG. 14 is a block diagram illustrating a functional configuration example of the electrostatic-capacitive proximity detecting device 3B according to the present embodiment. As illustrated in FIG. 14, the electrostatic-capacitive proximity detecting device 3B includes an electrostatic capacitance detector 10B, in place of the electrostatic capacitance detector 10 according to the first embodiment, and a position detector 11B, in place of the position detector 11 according to the first embodiment. With a configuration below, the electrostatic-capacitive proximity detecting device 3B executes processing below.

As shown in FIG. 13B, with respect to the electrode unit 4B, the electrodes Dxy linearly arranged along the up-and-down direction are grouped into first groups that each function as one electrode. As a result, a first group Gx1 to which four electrodes Dxy constituted by the electrodes D11, D21, D31, and D41 belong, a first group Gx2 to which four electrodes Dxy constituted by the electrodes D12, D22, D32, and D42, a first group Gx3 to which four electrodes Dxy constituted by the electrodes D13, D23, D33, and D43 belong, a first group Gx4 to which four electrodes Dxy constituted by the electrodes D14, D24, D34, and D44 belong, and a first group Gx5 to which four electrodes Dxy constituted by the electrodes D15, D25, D35, and D45 belong are formed, as illustrated in FIGS. 13A and 13B.

With respect to the electrode unit 4B, the electrodes Dxy linearly arranged along the left-and-right direction are grouped into second groups that each function as one electrode. As a result, a second group Gy1 to which five electrodes Dxy constituted by the electrodes D11, D12, D13, D14, and D15 belong, a second group Gy2 to which five electrodes Dxy constituted by the electrodes D21, D22, D23, D24, and D25 belong, a second group Gy3 to which five electrodes Dxy constituted by the electrodes D31, D32, D33, D34, and D35 belong, and a second group Gy4 to which five electrodes Dxy constituted by the electrodes D41, D42, D43, D44, and D45 belong are formed, as illustrated in FIGS. 13A and 13B.

Figure 15:
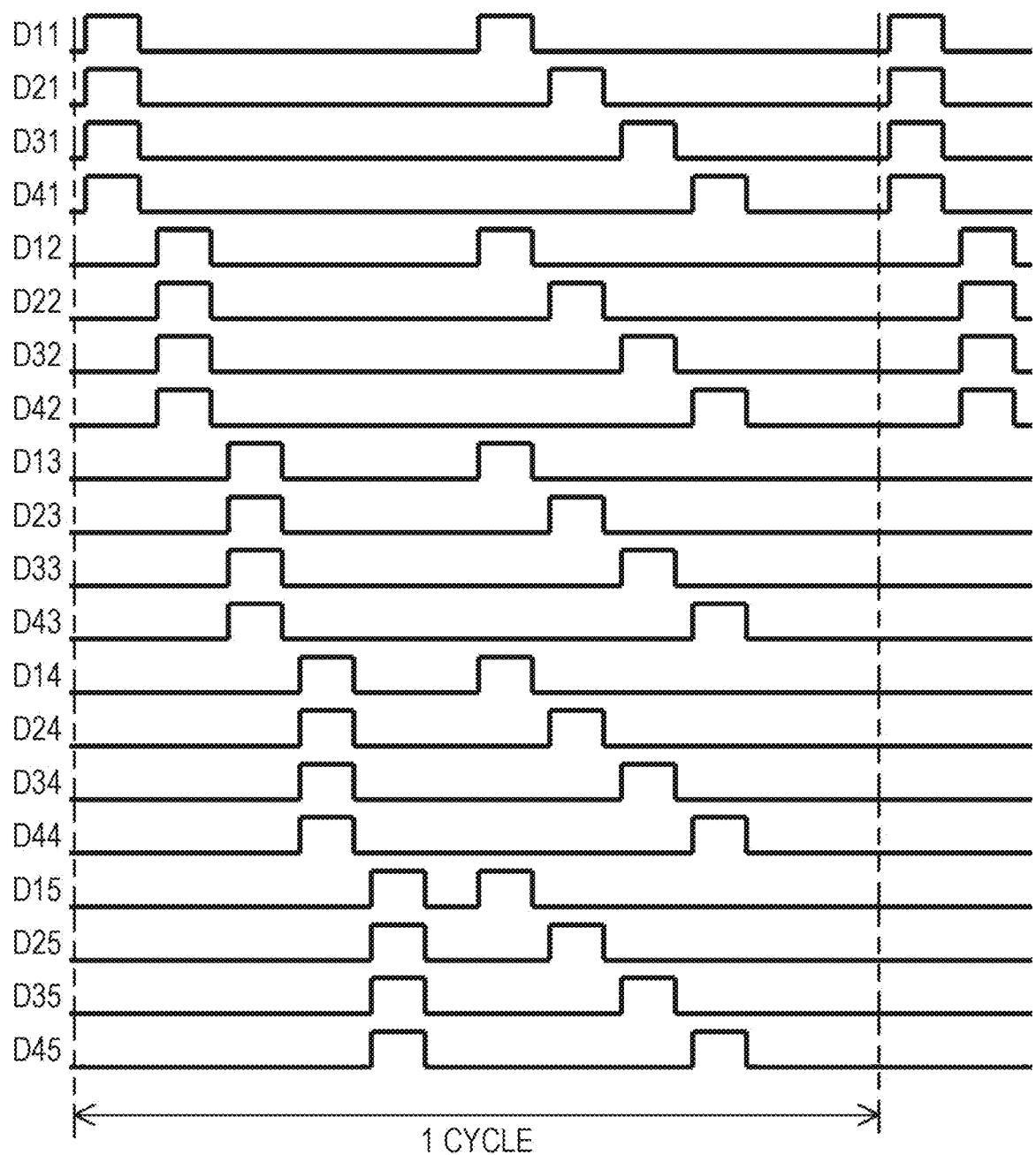
FIG. 15 is a timing chart illustrating timings at which electrodes are driven.

In one cycle, the electrostatic capacitance detector 10B drives the individual groups in a time division manner and detects detection values corresponding to electrostatic capacitances between the to-be-detected object and the respective groups. FIG. 15 is a timing chart illustrating timings at which the electrodes Dxy are driven. As illustrated in FIG. 15, in one cycle, the electrostatic capacitance detector 10B drives the electrodes D11, D21, D31, and D41, which belong to the first group Gx1, at timing T0 and drives the electrodes D12, D22, D32, and D42, which belong to the first group Gx2, at timing T1 subsequent to timing T0. Similarly, the electrostatic capacitance detector 10B drives the first group Gx3, the first group Gx4, the first group Gx5, the second group Gy1, the second group Gy2, the second group Gy3, and the second group Gy4 in that order.

Since the adjacent electrodes Dxy belonging to one group are driven at the same time, this group functions as one electrode. The positions of the respective first groups are defined as x-coordinate values on the axis Jx. The x-coordinate value of each first group is the coordinate value of a center point of the region where the electrodes Dxy belonging to the first group are arranged.

For example, referring to FIG. 13B, the x-coordinate value of the first group Gx1 is the x-coordinate value of a center point RT of the region where the electrodes D11, D21, D31, and D41 belonging to the first group Gx1 are arranged. Similarly, the positions of the respective second groups are defined as y-coordinate values on the axis Jy. The y-coordinate value of each second group is the coordinate value of a center point of the region where the electrodes Dxy belonging to the second group are arranged. For example, referring to FIG. 13B, the y-coordinate value of the second group Gy1 is the y-coordinate value of a center point ST of the region where the electrodes D11, D12, D13, D14, and D15 belonging to the second group Gy1 are arranged.

In one cycle, the electrostatic capacitance detector 10B drives the groups in a time division manner, detects detection values for the driven groups, and outputs the detection values to the position detector 11B. For example, in response to the driving of the first group Gx1, the electrostatic capacitance detector 10B detects a detection value for the first group Gx1, and outputs the detection value to the position detector 11B. As a result of the above-described processing, the detection values for all the groups are output from the electrostatic capacitance detector 10B to the position detector 11B in one cycle.

In one cycle, the position detector 11B receives the detection values for the respective groups from the electrostatic capacitance detector 10B. Then, based on the detection values for the first group Gx1 to Gx5, the position detector 11B derives a correspondence value Nx in accordance with calculation expression Sx below:

$$Nx=(Bx1*Ex1+Bx2*Ex2+Bx3*Ex3+Bx4*Ex4+Bx5*Ex5)/(Ex1+Ex2+Ex3+Ex4+Ex5)$$

where Bx1, Bx2, Bx3, Bx4, and Bx5 are x-coordinate values of the first groups Gx1, Gx2, Gx3, Gx4, and Gx5, respectively, and Ex1, Ex2, Ex3, Ex4, and Ex5 are detection values for the first groups Gx1, Gx2, Gx3, Gx4, and Gx5, respectively.

The calculation expression Sx is an expression for deriving the correspondence value Nx by performing weighted averaging in which the detection values for the respective first groups are weights, and the positions of the first groups in the left-and-right direction are variables. The accuracy of the correspondence value Nx derived in the manner described above is high, as in the first embodiment.

In addition, based on the detection values for the second groups Gy1 to Gy4, the position detector 11B derives a correspondence value Ny in accordance with calculation expression Sy below:

$$Ny=(By1*Ey1+By2*Ey2+By3*Ey3+By4*Ey4)/(Ey1+Ey2+Ey3+Ey4)$$

where By1, By2, By3, and By4 are the y-coordinate values of the second groups Gy1, Gy2, Gy3, and Gy4, respectively, and Ey1, Ey2, Ey3, and Ey4 are the detection values for the second groups Gy1, Gy2, Gy3, and Gy4, respectively.

The calculation expression Sy is an expression for deriving the correspondence value Ny by performing weighted averaging in which the detection values for the respective second groups Gy are weights, and the positions of the second groups Gy in the up-and-down direction are variables. The accuracy of the correspondence value Ny derived in the manner described above is high, as in the second embodiment.

Through deriving the correspondence value Nx and the correspondence value Ny in the manner described above, the position detector 11B highly accurately detects both the position of the to-be-detected object in the left-and-right direction and the position of the to-be-detected object in the up-and-down direction.

In the present embodiment, thresholds for two opposite ends in the left-and-right direction and thresholds for two opposite ends in the up-and-down direction are pre-determined for a predetermined rectangular region. The position detector 11B determines whether or not the correspondence value Nx derived in a certain cycle is in a range defined by the thresholds for the two opposite ends in the left-and-right direction and the correspondence value Ny is in a range defined by the thresholds for the two opposite ends in the up-and-down direction. When the correspondence values Nx and Ny are in the ranges, the position detector 11B determines that the to-be-detected object is located in the rectangular region.

In the present embodiment, two or more electrodes included in the electrodes Dxy and linearly arranged in the left-and-right direction are grouped into one group, which is caused to function as one electrode, and two or more electrodes included in the electrodes Dxy and linearly arranged in the up-and-down direction are grouped into one group, which is caused to function as one electrode. This is due to the following reason. That is, since an increase in the area of the surface of the electrode unit 4B leads to an increase in the size of the apparatus, the area of the surface of the electrode unit 4B is equivalent to that in the first and second embodiments. On the other hand, since the number of electrodes Dxy in the present embodiment is larger than that in each of the first and second embodiments, the surface area of each electrode Dxy is small.

Thus, if a configuration in which each of the electrodes Dxy is driven, and the detection value thereof is detected is employed, the detection sensitivity for each electrode Dxy is small (the electrostatic capacitance is proportional to the area of the electrode, as is known), which may cause a decrease in the accuracy of the correspondence value that is eventually derived. Hence, in the present embodiment, two or more electrodes included in the electrodes Dxy are caused to function as one electrode to suppress a detection sensitivity decrease due to the small areas of the electrodes Dxy, thereby reducing a decrease in the accuracy of the correspondence value.

In the present embodiment, both suppressing an increase in the apparatus size and suppressing a reduction in the accuracy of the correspondence value are realized based on the feature of the structure in which the electrodes Dxy are arranged in a matrix and the features of the processing in which two or more electrodes included in the electrodes Dxy and linearly arranged along the up-and-down direction are grouped into one group, two or more electrodes included in the electrodes Dxy and linearly arranged along the left-and-right direction are grouped into one group, and driving is performed for each group.

Fourth Embodiment

Figure 16:
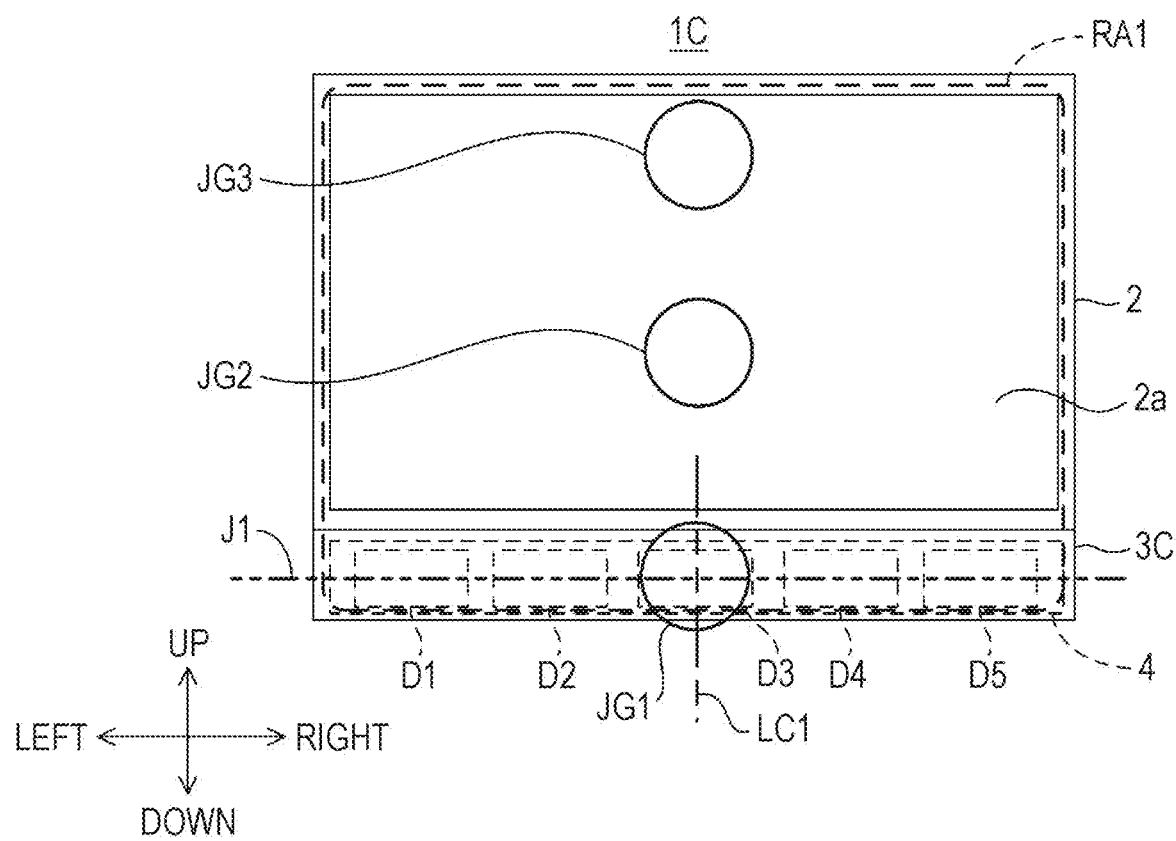
FIG. 16 is a front view of an in-vehicle apparatus according to a fourth embodiment.

Next, a fourth embodiment will be described. FIG. 16 is a simplified front view schematically illustrating an in-vehicle apparatus 1C according to the present embodiment. In the fourth embodiment described below, elements that are substantially the same as those in the first embodiment are denoted by the same reference numerals, and descriptions thereof are not given hereinafter. In the following description, a position in the up-and-down direction may be referred to as an "up-and-down position", and a position in the left-and-right direction may be referred to as a "left-and-right position".

As illustrated in FIG. 16, the in-vehicle apparatus 1C according to the present embodiment includes a display panel 2, which has a display screen 2a, and an electrostatic-capacitive proximity detecting device 3C. The electrostatic-capacitive proximity detecting device 3C includes an electrode unit 4. The electrode unit 4 has a structure as described in the first embodiment, and the electrode unit 4 includes five electrodes D1 to D5 linearly arranged along the left-and-right direction (one direction). Coordinate values are defined on the axis J1 along the electrodes D1 to D5 and virtual movement axes used in the present embodiment, as in the first embodiment. That is, the coordinate value of the position of the electrode D1 is "1", the coordinate value of the position of the electrode D2 is "2", the coordinate value of the position of the electrode D3 is "3", the coordinate value of the position of the electrode D4 is "4", and the coordinate value of the position of the electrode D5 is "5".

Figure 17:
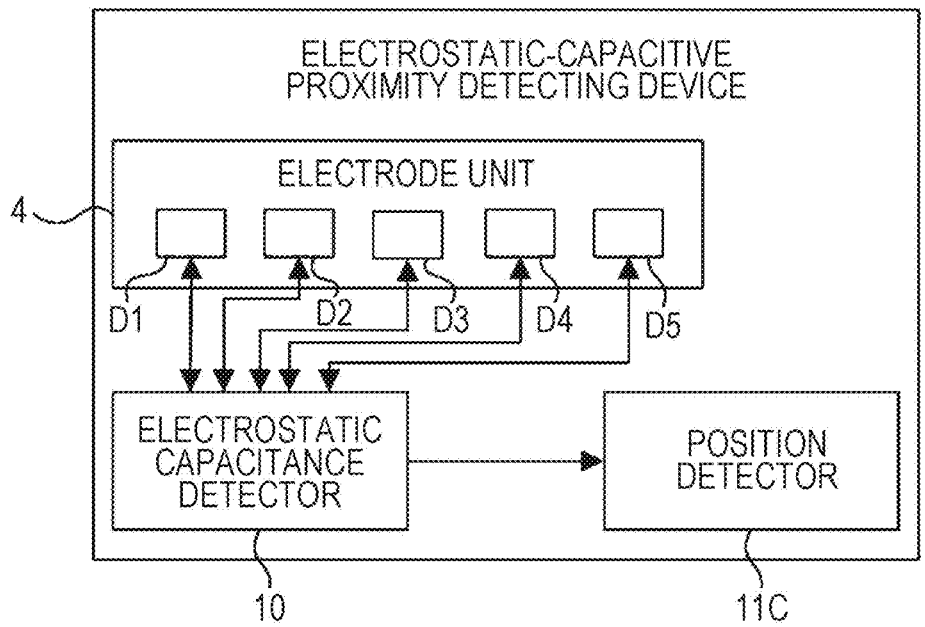
FIG. 17 is a block diagram illustrating a functional configuration example of an electrostatic-capacitive proximity detecting device according to the fourth embodiment.

FIG. 17 is a block diagram illustrating a functional configuration example of the electrostatic-capacitive proximity detecting device 3C according to the present embodiment. As illustrated in FIG. 17, the electrostatic-capacitive proximity detecting device 3C includes a position detector 11C in place of the position detector 11 according to the first embodiment.

In the above-described first example of the first embodiment, it is assumed that, for a contactless input, the person in the vehicle is notified in advance that the to-be-detected object is to be placed at a position close to the electrode unit 4, and during the contactless input, the to-be-detected object is located adjacent to the electrode unit 4. On the other hand, in the present embodiment, rather than being notified that the to-be-detected object is to be placed at a position close to the electrode unit 4 for a contactless input, the person in the vehicle is notified in advance that the to-be-detected object is to be placed at a position that is directly in front of the electrode unit 4 and that is close to the electrode unit 4 or at a position that is directly in front of the display screen 2a and that is close to the display screen 2a. Accordingly, it is assumed that during the contactless input, the to-be-detected object is located in a region RA1 surrounded by a dashed line in FIG. 16.

In this case, when the distances from the to-be-detected object to the front surface of the in-vehicle apparatus 1C are assumed to be generally the same, the amount of spacing between the to-be-detected object and the electrode unit 4 increases as the to-be-detected object moves upward in the region RA1 from a position directly in front of the electrode unit 4. For example, referring to FIG. 16, with respect to a position indicated by a reference numeral JG1, a position indicated by a reference numeral JG2, and a position indicated by a reference numeral J3, the position JG2 is located above the position JG1, and the position JG3 is located above the position JG2. In this case, "the amount of spacing between the position JG1 and the electrode unit 4"<"the amount of spacing between the position JG2 and the electrode unit 4"<"the amount of spacing between the position JG3 and the electrode unit 4" holds.

Cases in which the to-be-detected object is located at a place that is located above and away from the electrode unit 4 during a contactless input, as described above, are envisaged in the present embodiment. There is a characteristic that the more upward the to-be-detected object is located, the larger the amount of spacing between the to-be-detected object and the electrode unit 4 is. Thus, there is a problem in that the amount of spacing between the to-be-detected object and the electrode unit 4 increases not only when the to-be-detected object moves upward but also as the to-be-detected object moves frontward from the electrode unit 4.

That is, an electric field formed by the electrodes D extends spherically. Accordingly, a graph for each electrode D measured at individual positions (i.e., each graph illustrated in FIG. 5 which indicates the relationships between the position of the to-be-detected object in the left-and-right direction on a virtual movement axis and the detection value for each electrode D) when the virtual movement axis is gradually moved away from the electrodes D is as follows. Each graph indicating the relationship between the left-and-right position of the to-be-detected object with respect to each electrode D and the detection value for the electrode D is hereinafter referred to as a "detection-value transition graph". That is, as the amount of spacing between the electrode unit 4 and the virtual movement axis (i.e., the position of the to-be-detected object) increases, the value of the peak of each detection-value transition graph decreases, and the spread of distribution of the detection values (the spread of distribution of the electric field formed by the electrode D; i.e., skirt portions of the mountain-like detection-value transition graph) increases.

Figure 18:
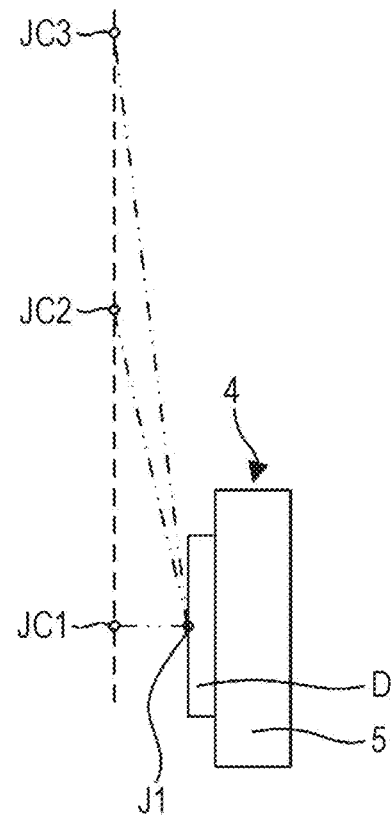
FIG. 18 is a right side view of an electrode unit.

FIG. 18 is a right side view of the electrode unit 4, as in FIG. 6, and illustrates three virtual movement axes JC1 to JC3 in conjunction with the electrode D. The virtual movement axes JC1 to JC3 are different from each other in the amount of spacing from the electrode D. As illustrated in FIG. 18, the virtual movement axis JC2 is located above the virtual movement axis JC1, and the virtual movement axis JC3 is located above the virtual movement axis JC2. Accordingly, the amounts of spacing from the electrodes D to the three virtual movement axes JC1 to JC3 are given by "the amount of spacing for the virtual movement axis JC1"<"the amount of spacing for the virtual movement axis JC2"<"the amount of spacing for the virtual movement axis JC3". The amount of spacing between the axis J1 and the virtual movement axis can be regarded as the amount of spacing between the electrode unit and the to-be-detected object.

Figure 19:
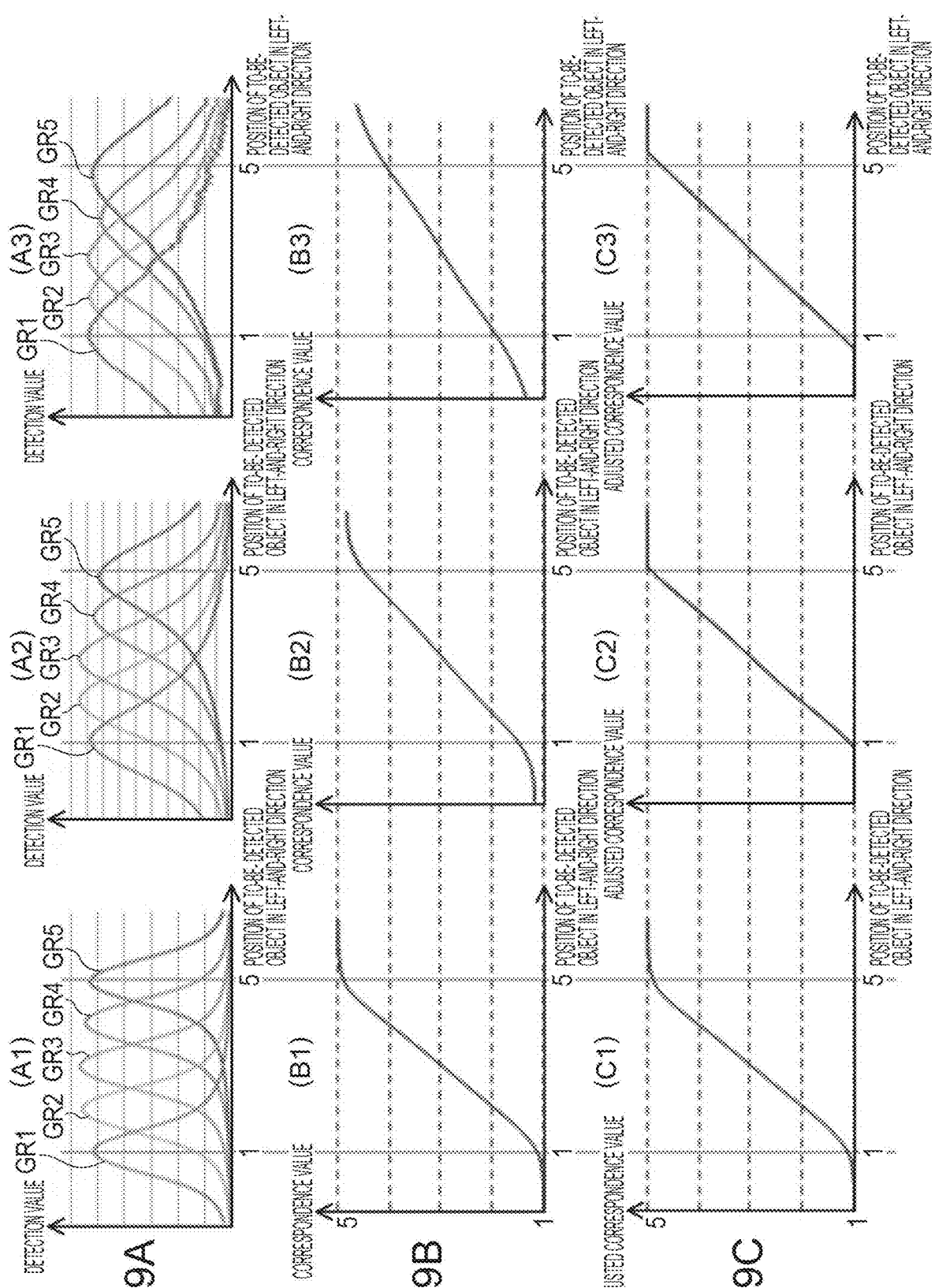
FIGS. 19A, 19B, and 19C illustrate transition of the detection values, transition of the correspondence value, and transition of adjusted correspondence values, respectively.

FIG. 19A illustrates detection-value transition graphs of the measurement values detected for the virtual movement axes JC1 to JC3. More specifically, FIG. 19A are graphs each indicating relationships between the position of the to-be-detected object in the left-and-right direction and the detection values for the electrodes D when the to-be-detected object moves on the corresponding virtual movement axis in the left-and-right direction. In each of the graphs in FIG. 19A, the horizontal axis represents the position of the to-be-detected object in the left-and-right direction, and the vertical axis represents the detection values for the electrodes D. (A1) in FIG. 19A illustrates a detection-value transition graph based on a result of measurement on the virtual movement axis JC1, (A2) in FIG. 19A illustrates a detection-value transition graph based on a result of measurement on the virtual movement axis JC2, and (A3) in FIG. 19A illustrates a detection-value transition graph based on a result of measurement on the virtual movement axis JC3. In FIG. 19A, reference numerals GR1, GR2, GR3, GR4, and GR5 are given to the detection-value transition graphs for the electrodes D1, D2, D3, D4, and D5, respectively, as in FIG. 5.

In FIG. 19A, for ease of visibility, scales of scale marks on the vertical axes are adjusted so that the peaks of the respective detection-value transition graphs in (A1) to (A3) in FIG. 19A become approximately the same. However, the peak of each detection-value transition graph decreases as the amount of spacing between the electrode D and the virtual movement axis increases (the amount of spacing is approximately equal to the amount of spacing between the electrode D and the to-be-detected object), as described above, and thus, when the scales of the scale marks on the vertical axes in (A1) to (A3) in FIG. 19A are the same, the peak of the detection-value transition graph in (A2) in FIG. 19A is smaller than the peak of the detection-value transition graph in (A1) in FIG. 19A, and the peak of the detection-value transition graph in (A3) in FIG. 19A is smaller than the peak of the detection-value transition graph in (A2) in FIG. 19A.

As illustrated in FIG. 19A, the spread of the distribution of the detection values in each detection-value transition graph (skirt portions of each detection-value transition graph) for the virtual movement axis JC2 is larger than that for the virtual movement axis JC1, and also the spread of the distribution of the detection values in each detection-value transition graph (skirt portions of each detection-value transition graph) for the virtual movement axis JC3 is larger than that for the virtual movement axis JC2. As a result, for example, when attention is given to the coordinate value "1" at which the detection value for the electrode D1 reaches its peak, in the case of the virtual movement axis JC1 ((A1) in FIG. 19A), the detection value at the peak is detected for the electrode D1, whereas only fractional magnitudes of the detection value for the electrode D1 are detected for the electrodes D2 to D5. Meanwhile, in the case of the virtual movement axis JC2 ((A2) in FIG. 19A), the detection value for the electrode D2 exceeds one-half of the detection value for the electrode D1, and the detection values (relative to the detection value for the electrode D1) that are larger than the detection values for the virtual movement axis JC1 are also detected for the electrodes D3 to D5. In the case of the virtual movement axis JC3 ((A3) in FIG. 19A), the detection values for the electrodes D2 to D5 (relative to the detection value for the electrode D1) are larger than the detection values for the virtual movement axis JC2.

FIG. 19B illustrates relationships between the left-and-right position of the to-be-detected object and the correspondence values N with respect to the virtual movement axes JC1 to JC3, when the to-be-detected object moves in the left-and-right direction along the virtual movement axis, as in FIG. 7A. In each graph in FIG. 19B, the horizontal axis represents the position of the to-be-detected object in the left-and-right direction, and the vertical axis represents the correspondence value N. Each graph indicating the relationships between the left-and-right position of the to-be-detected object and the correspondence value N is hereinafter referred to as a "correspondence-value transition graph". (B1) in FIG. 19B corresponds to the virtual movement axis JC1, (B2) in FIG. 19B corresponds to the virtual movement axis JC2, and (B3) in FIG. 19B corresponds to the virtual movement axis JC3. With regard to each of the correspondence-value transition graphs, it can be said that as the coordinate value on the horizontal axis and the correspondence value N on the vertical axis with respect to each point on the correspondence-value transition graph become closer to each other (i.e., as a graph obtained by plotting points at which values on the horizontal axis and values on the vertical axis are equal to each other becomes more similar to the correspondence-value transition graph), the accuracy is higher.

As illustrated in (B1) in FIG. 19B, with respect to the virtual movement axis JC1, the horizontal axis coordinate values of points on the correspondence-value transition graph are approximately equal to the correspondence values N on the vertical axis, and thus the accuracy of the correspondence-value transition graph can be said to be high. As illustrated in (B2) in FIG. 19B, with respect to the virtual movement axis JC2, the horizontal axis coordinate values of points on the correspondence-value transition graph partly deviate from the correspondence values N on the vertical axis, and thus the accuracy is low compared with the correspondence-value transition graph for the virtual movement axis JC1.

More specifically, in the correspondence-value transition graphs indicating the relationships between the coordinate values and the correspondence values N, it is ideal that the correspondence value N be "1" when the coordinate value is "1". However, in the correspondence-value transition graph illustrated in (B2) in FIG. 19B with respect to the virtual movement axis JC2, the correspondence value N is about "1.5" when the coordinate value is "1", and at this portion, a larger deviation occurs between the coordinate value and the correspondence value N, compared with the correspondence-value transition graph for the virtual movement axis JC1. The deviation at the coordinate value "1" occurs due to the following cause.

That is, since the correspondence value N is derived according to the calculation expression S1, it is necessary that only the detection value for the electrode D1 be detected and the detection values for the electrodes D2 to D5 not be detected at the position of the coordinate value "1" on the virtual movement axis JC2, in order for the correspondence value N at the coordinate value "1" to reach "1". Conversely, as the magnitudes of the detection values for the electrodes D2 to D5 which are detected at the coordinate value "1" (the magnitudes of the detection values D2 to D5 relative to the detection value for the electrode D1) increase, the correspondence value N deviates greatly from "1" (which is the ideal value of the correspondence value N in this case). In the case of the virtual movement axis JC2, the spread of the distribution of the detection values in the detection-value transition graph (i.e., the skirt portions of the detection-value transition graph) each electrode D increases, compared with the virtual movement axis JC1, as described above. Owing to the increase, the detection values for the electrodes D2 to D5 which are detected at the position of the coordinate value "1" on the virtual movement axis JC2 become relatively large. Thus, in the correspondence-value transition graph for the virtual movement axis JC2, a deviation occurs at the coordinate value "1".

Hereinafter, a deviation between the ideal correspondence value N(=the actual coordinate value of the to-be-detected object) and the correspondence value N that is actually derived is referred to as a "correspondence-value deviation", and the magnitude (amount) of the deviation is referred to as an "amount of correspondence-value deviation". Referring to (B2) in FIG. 19B, the correspondence-value deviation also occurs at the position of the coordinate value "5", and this is due to the same reason with respect to the correspondence-value deviation at the position of the coordinate value "1".

In the correspondence-value transition graph ((B2) in FIG. 19B) with respect to the virtual movement axis JC2, the amount of correspondence-value deviation between the ideal correspondence value N and the correspondence value N that is actually derived increases as the position of the to-be-detected object on the virtual movement axis JC2 gets farther from an electrode-group center position of the electrode unit 4 in the left-and-right direction increases. The "electrode-group center position of the electrode unit 4" refers to the position (the left-and-right position) of a center portion of, in the left-and-right direction (one direction), the region where (all) the electrodes D in the electrode unit 4 are arranged. In the present embodiment, specifically, the electrode-group center position is a left-and-right position corresponding to a center (denoted by reference numeral LC1 in FIG. 16) of the electrode D3 in the left-and-right direction, and thus the coordinate value of the electrode-group center position is "3". In the present embodiment, the electrode-group center position having the coordinate value "3" can be defined for all the virtual moving axes. For example, the position of the coordinate value "1" is farther from the electrode-group center position (=the position of the coordinate value "3") than the position of the coordinate value "2". The amount of correspondence-value deviation at the coordinate value "1" is larger than the amount of correspondence-value deviation at the coordinate value "2". This is because the electrodes D1 to D5 are bilaterally symmetric with respect to the electrode-group center position, and as the distance from electrode-group center position increases, the bilateral symmetry of the electrodes D disappears, and the bias increases.

As illustrated in (B3) in FIG. 19B, in the correspondence-value transition graph for the virtual movement axis JC3, the amount of correspondence-value deviation increases as the position of the to-be-detected object gets farther from the electrode-group center position in the left-and-right direction, as in the correspondence-value transition graph for the virtual movement axis JC2. As is apparent from comparison between the correspondence-value transition graph for the virtual movement axis JC2 and the correspondence-value transition graph for the virtual movement axis JC3, the amount of correspondence-value deviation in the correspondence-value transition graph for the virtual movement axis JC3 is larger than the amount of correspondence-value deviation in the correspondence-value transition graph for the virtual movement axis JC2 when the left-and-right position of the to-be-detected object is the same. This is because the virtual movement axis JC3 is located at a position farther from the electrode unit 4 than the virtual movement axis JC2, and the spread of the distribution of the detection values in the detection-value transition graph for each electrode D is large. When this point is generalized, the correspondence values can be said to have the following characteristics.

<Characteristic F1> When the position of the to-be-detected object in the left-and-right direction is the same, the amount of correspondence-value deviation increases as the amount of spacing between the to-be-detected object and the electrode unit 4 increases.

With respect to characteristic F1, there are further characteristics described below.

<Characteristic F1-1> When the to-be-detected object is located to the left of the electrode-group center position, the correspondence value N that is actually derived increases as the amount of spacing between the to-be-detected object and the electrode unit 4 increases.

Figure 20:
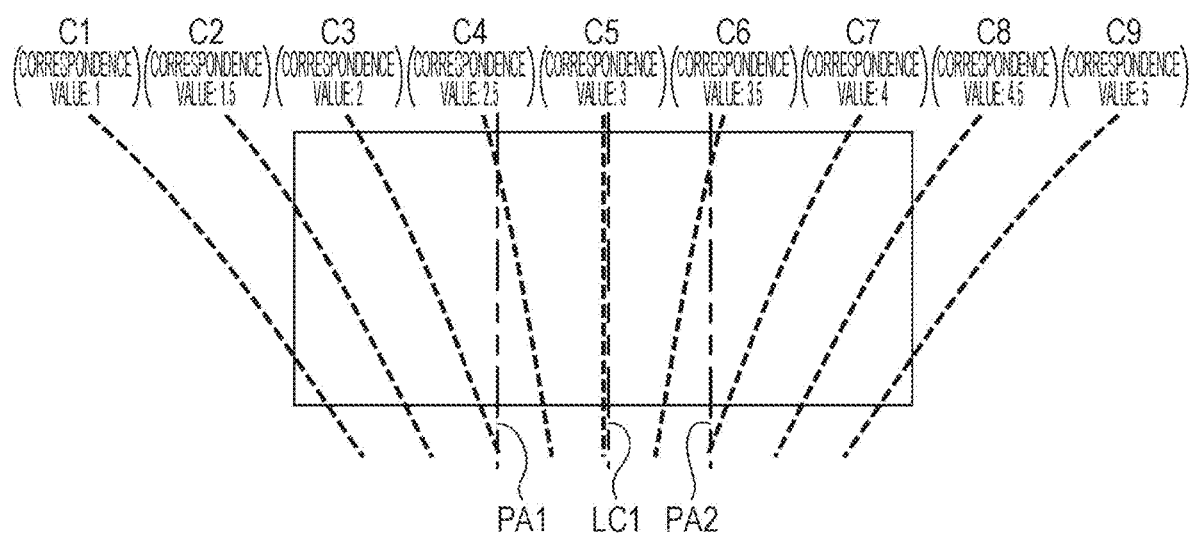
FIG. 20 illustrates correspondence values detected on a virtual movement surface.

Characteristic F1-1 will now be described below in detail. FIG. 20 illustrates curves, each being obtained by connecting points at which the same correspondence values N are derived on a virtual surface (hereinafter referred to as a "virtual movement surface") that is a certain-distance spaced in a depth direction from the surface (the surface at the front side) of the display screen 2a and that extends parallel to the surface of the display screen 2a. In FIG. 20, reference numeral LC1 represents the electrode-group center position. In FIG. 20, a curve C1 is a curve obtained by connecting points at which the correspondence values N "1" are derived. Accordingly, when the to-be-detected object (e.g., a hand) is located on the curve C1 on the virtual movement surface, "1" is detected as the correspondence value N. In FIG. 20, curves C2, C3, C4, C5, C6, C7, C8, and C9 are curves on which the correspondence values N correspond to "1.5", "2", "2.5", "3", "3.5", "4", "4.5", and "5", respectively.

For example, in FIG. 20, a straight line PA1 represents the left-and-right position of the coordinate value "2" on the virtual movement surface. In essence, at whichever position on the straight line PA1 the to-be-detected object is located, it is ideal that the correspondence value N be "2". However, owing to characteristic F1-1, as the to-be-detected object moves upward on the straight line PA1 (i.e., as the amount of spacing between the to-be-detected object and the electrode unit 4 increases), the correspondence value N that is actually derived deviates from "2" and becomes larger.

<Characteristic F1-2> When the to-be-detected object is located to the right of the electrode-group center position, the correspondence value N that is actually derived decreases as the amount of spacing between the to-be-detected object and the electrode unit 4 increases.

For example, in FIG. 20, a straight line PA2 represents the left-and-right position of the coordinate value "4" on the virtual movement surface. In essence, at whichever position on the straight line PA2 the to-be-detected object is located, it is ideal that the correspondence value N be "4". However, owing to characteristic F1-2, as the to-be-detected object moves upward on the straight line PA2 (i.e., as the amount of spacing between the to-be-detected object and the electrode unit 4 increases), the correspondence value N that is actually derived deviates from "4" and becomes smaller.

Also, as illustrated in FIG. 20, when the to-be-detected object is moved on the curve having the same correspondence values N, the amount of spacing in the left-and-right direction between the left-and-right position of the to-be-detected object and the electrode-group center position increases as the to-be-detected object moves upward from a position directly in front of the electrode unit 4 (as the to-be-detected object gets farther from the electrode unit 4). The amount of spacing in the left-and-right direction between the left-and-right position of the to-be-detected object and the electrode-group center position can also be restated as the absolute value of the difference between the coordinate value of the left-and-right position of the to-be-detected object and the coordinate value ("3" in the present embodiment) of the electrode-group center position. For example, when attention is given to the curve C1 of the correspondence value N "1", it is apparent from the relationship between the straight line LC1 and the curve C1 that the amount of spacing in the left-and-right direction between the position of the to-be-detected object and the straight line LC1 increases as the to-be-detected object moves upward on the curve C1 (i.e., as the to-be-detected object moves away from the electrode unit 4).

When this point is generalized, it can be said that the correspondence values further have characteristics described below.

<Characteristic F2> When the correspondence values N derived at different points are the same, the amount of spacing in the left-and-right direction between each point and the electrode-group center position increases as the amount of spacing between each point and the electrode unit 4 increases.

Characteristics F1 and F2 described above cause a reduction in the accuracy of detecting the position of the to-be-detected object. For example, in the first example (described with reference to FIG. 7B) of the first embodiment, the position detector 11 determines whether or not the correspondence value N is in the certain range defined using two thresholds, to thereby determine whether or not the to-be-detected object is located in the valid region. However, when the position of the to-be-detected object in the left-and-right direction is the same, the correspondence value N deviates more greatly from the actual coordinate value of the to-be-detected object as the to-be-detected object gets farther from the electrode unit 4, as in characteristic F1. Thus, in a situation in which the to-be-detected object is sufficiently far from the electrode unit 4, a case in which it is determined that the to-be-detected object is located in the valid region can occur even though the to-be-detected object is, in practice, located at a place outside the valid region. This is also true for the second example described above with reference to FIG. 8.

Figure 21A:
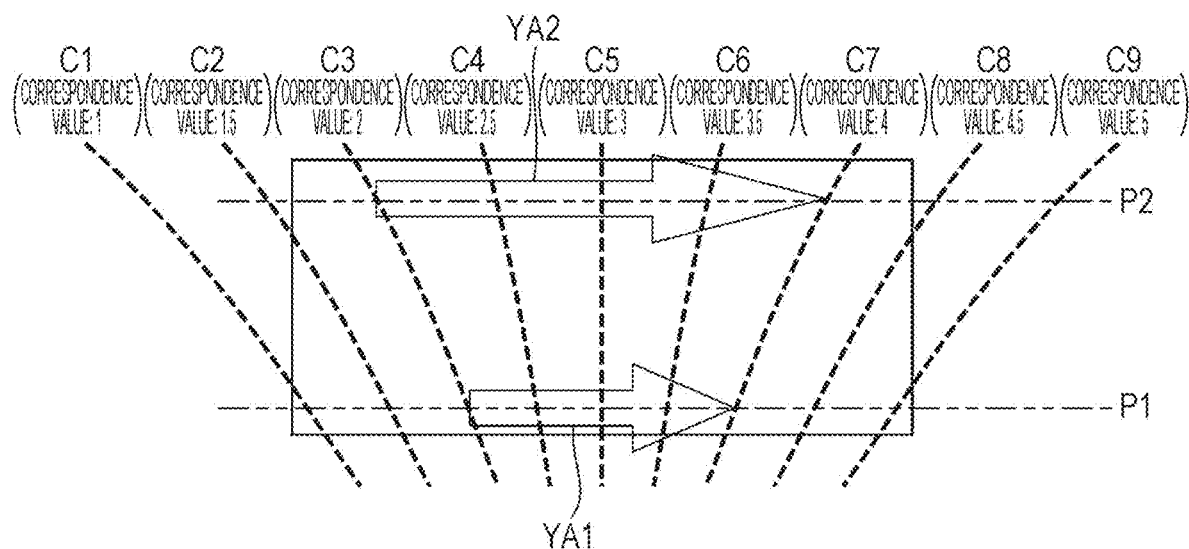
FIG. 21A illustrates the correspondence values detected on the virtual movement surface.

Also, in the third example of the first embodiment, problems described below arise. FIG. 21A illustrates curves C1 to C9 on the virtual movement surface, as in FIG. 20. As illustrated in FIG. 21A, an up-and-down position P1 and an up-and-down position P2, which is located above the up-and-down position P1, are assumed on the virtual movement surface. Now, consider a configuration in which a reference amount is "2", and the position detector 11C makes the valid determination when the amount of change in the correspondence value N becomes larger than or equal to "2". In the case of this configuration, when the correspondence value changes from "2" to "4" at the up-and-down position P1 illustrated in FIG. 21A, as indicated by arrow YA1, the amount of change in the correspondence value N becomes larger than or equal to "2", which is the reference amount, and thus the position detector 11C makes the valid determination. Similarly, when the correspondence value changes from "2" to "4" at the up-and-down position P2, as indicated by arrow YA2, the amount of change in the correspondence value N becomes larger than or equal to "2", which is the reference amount, and thus the position detector 11C makes the valid determination.

As is apparent from comparison between arrow YA1 and arrow YA2, the amount of physical movement by which the to-be-detected object is to be moved in order for the valid determination to be made differs greatly between the up-and-down position P1 and the up-and-down position P2. When this is generalized, the amount of physical movement by which the to-be-detected object is to be moved on the virtual movement surface in order for the valid determination to be made increases as the to-be-detected object is located more upward from a position directly in front of the electrode unit 4, or the amount of movement by which the to-be-detected object is to be moved in order for the valid determination to be made increases as the amount of spacing between the electrode unit 4 and the to-be-detected object increases. This means that the amount of movement by which the person in the vehicle is to move the to-be-detected object (e.g., his or her hand) in order for the valid determination to be made differs depending on the place of the to-be-detected object, which can make the person in the vehicle to have a sense of discomfort during a contactless input.

Accordingly, the position detector 11C according to the present embodiment executes processing below in each cycle. That is, after receiving the detection values for the respective electrodes D, the position detector 11C derives the correspondence value N in accordance with a procedure that is similar to that in the first embodiment. In addition, the position detector 11C derives the comprehensive intensity EL, separately from the correspondence value N. The position detector 11C derives the comprehensive intensity EL by using calculation expression S2 below:

$$EL=E1+E2+E3+E4+E5$$

where EL represents the comprehensive intensity, and E1, E2, E3, E4, and E5 represent the detection values for the electrodes D1, D2, D3, D4, and D5, respectively.

As is apparent from the calculation expression S2, the comprehensive intensity EL is a total of the detection values for the electrodes D and means an overall strength of the detection values for the electrodes D. In principle, the comprehensive intensity EL has a tendency that its value decreases (increases) as the amount of spacing between the electrode unit 4 and the to-be-detected object (the virtual movement axis to which the to-be-detected object belongs) increases (decreases). Accordingly, the comprehensive intensity EL can be used as an indication value indicating to what degree the electrode unit 4 and the to-be-detected object are away from each other. Thus, the position detector 11C recognizes the degree of the amount of spacing between the electrode unit 4 and the to-be-detected object by deriving the comprehensive intensity EL.

The position detector 11C then derives a correspondence coefficient K, based on the comprehensive intensity EL. The significance of the correspondence coefficient K and a method for deriving the correspondence coefficient K are described later. After deriving the correspondence coefficient K, the position detector 11C derives an adjusted correspondence value N', which is obtained by adjusting the correspondence value N by using calculation expression S3 below:

$$N'=N+K(N-C)$$

where N' represents the adjusted correspondence value, N represents the correspondence value, C represents the coordinate value ("3" in the present embodiment) of the electrode-group center position, and K (K>0) represents the correspondence coefficient.

The position detector 11C adjusts the value of the correspondence coefficient K in the calculation expression S3 so that the value thereof increases as the comprehensive intensity EL increases.

The meaning of the calculation expression S3 will be described below. The part "N-C" in the calculation expression S3 is a value obtained by subtracting the coordinate value of the electrode-group center position from the correspondence value N derived from the calculation expression S1. That is, "N-C" is a value indicating the degree of the amount of displacement between the electrode-group center position and the position indicated by the correspondence value N. The value of "N-C" is (ideally) "0" when the to-be-detected object is located at the electrode-group center position. Also, when the to-be-detected object is located to the left of the electrode-group center position, the correspondence value N is smaller than the coordinate value of the electrode-group center position, and thus the value of "N-C" is a "negative" value. On the other hand, when the to-be-detected object is located to the right of the electrode-group center position, the correspondence value N is larger than the coordinate value of the electrode-group center position, and thus the value of "N-C" is a "positive" value.

As indicated by the calculation expression S3, the adjusted correspondence value N' is derived by adding "K(N-C)" (i.e., a value obtained by multiplying "N-C" by the correspondence coefficient K) to the correspondence value N. In the calculation expression S3, the part "K(N-C)" is a part that serves as an adjustment value for adjusting the correspondence value N so that the adjusted correspondence value N' gets as close as possible to the actual coordinate value.

More specifically, with respect to the correspondence value N, there are characteristics F1 (including characteristics F1-1 and F1-2) and F2. In view of these characteristics, adjusting the difference between the correspondence value N and the electrode-group center position in accordance with the amount of spacing between the to-be-detected object and the electrode unit 4 and adding the adjusted difference to the correspondence value N makes it possible to bring the adjusted correspondence value N' close to the actual coordinate value. The correspondence coefficient K serves as a coefficient for adjusting "N-C" (the difference between the correspondence value N and the electrode-group center position) in accordance with the amount of spacing between the to-be-detected object and the electrode unit 4. In order to give this function to the correspondence coefficient K, the magnitude of the correspondence coefficient K needs to be appropriately determined according to the degree of the amount of spacing between the electrode unit 4 and the to-be-detected object. Hence, in the present embodiment, the relationship between the correspondence coefficient K and the comprehensive intensity EL is defined based on prior testing or simulation. Since the comprehensive intensity EL can be used as an indication value indicating to what degree the to-be-detected object is spaced from the electrode unit 4, changing the correspondence coefficient K in accordance with the comprehensive intensity EL makes it possible to change the value of the correspondence coefficient K in accordance with the degree of the amount of spacing between the electrode unit 4 and the to-be-detected object.

In the present embodiment, the relationship between the correspondence coefficient K and the comprehensive intensity EL is defined as described below. That is, the to-be-detected object is placed at various places, the comprehensive intensities EL and the correspondence values N for the respective positions thereof are derived, and also appropriate values of the correspondence coefficients K (i.e., values with which the adjusted correspondence values N' derived according to the calculation expression S3 are approximately equal to the coordinate values) are determined through calculation. When combinations of the comprehensive intensities EL and the appropriate correspondence coefficients K for the various positions are accumulated, and regression analysis is performed on the accumulated combinations to determine a tendency curve of the comprehensive intensities EL and the correspondence values N. The tendency curve determined in such a manner is defined as a relationship between the correspondence coefficients K and the comprehensive intensities EL. A method for determining the relationship between the correspondence coefficients K and the comprehensive intensities EL is not limited to the example described above, and the relationship may be defined by a method other than the method using the tendency curve.

The relationship between the correspondence coefficients K and the comprehensive intensities EL is basically that the correspondence coefficient K increases as the comprehensive intensity EL decreases (i.e., as the amount of spacing between the electrode unit 4 and the to-be-detected object increases). Also, the absolute value of "N-C" increases as the correspondence value N gets farther from the coordinate value of the electrode-group center position. Moreover, when the to-be-detected object is present to the left of the electrode-group center position (in this case, the correspondence value N<C), "N-C" takes a negative value, and when the to-be-detected object is present to the right of the electrode-group center position (in this case, the correspondence value N>C), "N-C" takes a positive value. That is, when the to-be-detected object is present to the left of the electrode-group center position, the larger the amount of spacing between the electrode unit 4 and the to-be-detected object is, or the larger the absolute value of the difference between the correspondence value N and the electrode-group center position is, the larger the value is subtracted from the correspondence value N in the calculation expression S3. Also, when the to-be-detected object is present to the right of the electrode-group center position, the larger the amount of spacing between the electrode unit 4 and the to-be-detected object is, or the larger the difference (the absolute value of the difference) between the correspondence value N and the electrode-group center position is, the larger the value is added to the correspondence value N in the calculation expression S3.

As described above, before adjusting the correspondence value N by using the calculation expression S3, the position detector 11C derives the correspondence coefficient K, based on the comprehensive intensity EL. More specifically, for deriving the correspondence coefficient K, based on the tendency curve that defines the relationship between the correspondence coefficients K and the comprehensive intensities EL, the position detector 11C identifies, on the tendency curve, the correspondence coefficient K corresponding to the already-derived comprehensive intensity EL. By using the above-described method, the position detector 11C derives the correspondence coefficient K.

In the present embodiment, the position detector 11C recognizes the degree of the amount of spacing between the electrode unit 4 and the to-be-detected object and adjusts the correspondence value N by reflecting the degree of the amount of displacement between the electrode-group center position and the position indicated by the correspondence value N. Also, during the adjustment of the correspondence value N, the position detector 11C more strongly reflects the degree of the amount of displacement as the amount of spacing becomes larger. In specific processing, the position detector 11C adjusts the correspondence value N by adding a value, derived by multiplying a value obtained by subtracting a value indicating the electrode-group center position from the correspondence value N by the correspondence coefficient K (a coefficient), to the correspondence value N, and during the adjustment of the correspondence value N, the position detector 11C increases the correspondence coefficient K as the amount of spacing increases. Also, the position detector 11C derives the comprehensive intensity EL, which is an overall intensity of the detection values for the electrodes D, based on a detection result of the electrostatic capacitance detector 10, and recognizes the degree of the amount of spacing, based on the derived comprehensive intensity EL.

FIG. 19C illustrates relationships between the left-and-right position of the to-be-detected object and the adjusted correspondence values N' with respect to the virtual movement axes JC1 to JC3. In each graph in FIG. 19C, the horizontal axis represents the position of the to-be-detected object in the left-and-right direction, and the vertical axis represents the adjusted correspondence value N'. (C1) in FIG. 19C illustrates the adjusted correspondence values N' derived through adjustment of the correspondence values N in (B1) in FIG. 19B. That is, (C1) in FIG. 19C illustrates the adjusted correspondence values N' derived when the to-be-detected object is moved on the virtual movement axis JC1. (C2) in FIG. 19C illustrates the adjusted correspondence values N' derived through adjustment of the correspondence values N in (B2) in FIG. 19B. That is, (C2) in FIG. 19C illustrates the adjusted correspondence values N' derived when the to-be-detected object is moved on the virtual movement axis JC2. (C3) in FIG. 19C illustrates the adjusted correspondence values N' derived through adjustment of the correspondence values N in (B3) in FIG. 19B.

That is, (C3) in FIG. 19C illustrates the adjusted correspondence values N' derived when the to-be-detected object is moved on the virtual movement axis JC3.

In this example, when the to-be-detected object is located on the virtual movement axis JC1, the value of the correspondence coefficient K derived by the position detector 11C is a value close to "0"; when the to-be-detected object is located on the virtual movement axis JC2, the value of the correspondence coefficient K derived by the position detector 11C is a value close to "0.3"; and when the to-be-detected object is located on the virtual movement axis JC3, the value of the correspondence coefficient K derived by the position detector 11C is a value close to "0.7".

As is apparent from comparison between (B1) in FIG. 19B and (C1) in FIG. 19C, there is almost no change between the correspondence value N and the adjusted correspondence value N' with respect to the virtual movement axis JC1. This is because the correspondence coefficient K is "0" (a value close to "0"). The accuracy of the correspondence value N is intrinsically high for the virtual movement axis JC1, and the high accuracy is also maintained for the adjusted correspondence value N'. As is apparent from comparison between (B2) in FIG. 19B and (C2) in FIG. 19C, the adjusted correspondence value N' has a value at which the correspondence-value deviation, which occurs in the correspondence value N, decreases with respect to the virtual movement axis JC2, and thus, the accuracy of the adjusted correspondence value N' is high. With respect to the graph in (C2) in FIG. 19C, the position detector 11C corrects the adjusted correspondence value N' to 0 when the adjusted correspondence value N' derived according to the calculation expression S3 is smaller than 0, and performs clipping processing for correcting the adjusted correspondence value N' to 5 when the adjusted correspondence value N' is larger than 5. As is apparent from comparison between (B3) in FIG. 19B and (C3) in FIG. 19C, the adjusted correspondence value N' has a value at which the deviation, which occurs in the correspondence value N, decreases with respect to the virtual movement axis JC3, and the accuracy of the adjusted correspondence value N' is high. With respect to the graph in (C3) in FIG. 19C, the position detector 11C also performs clipping processing.

Figure 21B:
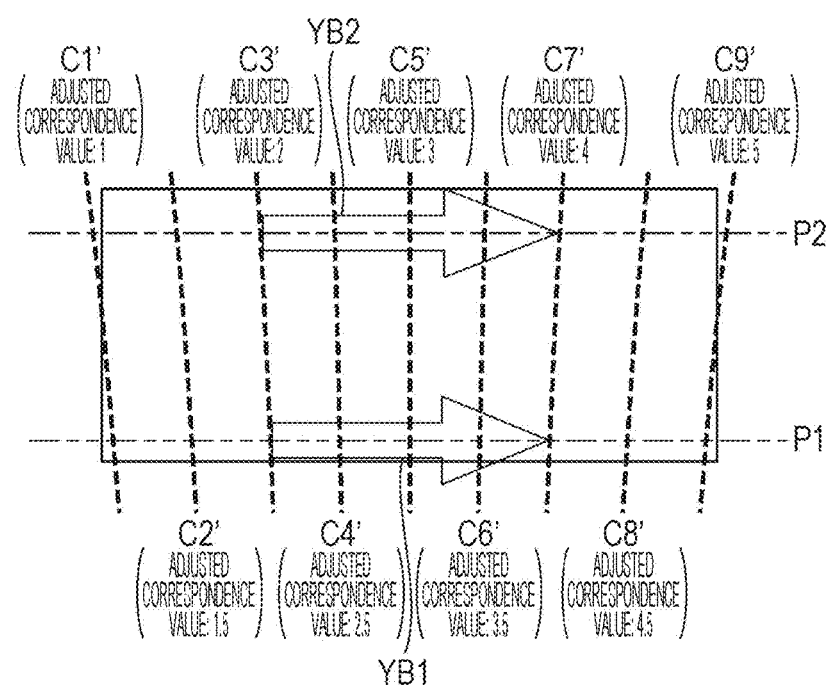
FIG. 21B illustrates adjusted correspondence values.

FIG. 21B illustrate curves obtained by connecting points at which the same adjusted correspondence values N' are derived on the virtual movement surface. In FIG. 21B, curves C1', C2', C3', C4', C5', C6', C7', C8', and C9' are curves on which the adjusted correspondence values N' correspond to "1", "1.5", "2", "2.5", "3", "3.5", "4", "4.5", and "5", respectively. As is apparent from comparison between FIG. 20 (or FIG. 21A) and FIG. 21B, it can be understood that the adjusted correspondence values N' have smaller deviations from the actual coordinate values than the correspondence values N.

In the present embodiment, the position detector 11C uses the adjusted correspondence value N', instead of the correspondence value N, as the position of the to-be-detected object in the left-and-right direction. The adjusted correspondence value N' is a value whose deviation from the actual coordinate value is reduced according to the amount of spacing between the electrode unit 4 and the to-be-detected object. That is, at whichever position the to-be-detected object is present, the adjusted correspondence value N' to be derived becomes close to the actual coordinate value. Thus, in the first example described above with reference to FIG. 7B or the second example described above with reference to FIG. 8, determining that the to-be-detected object that is actually located at a place outside the valid range is located in the valid range is suppressed.

In addition, a problem that arises in the third example is also addressed. Specifically, in the case of a configuration in which, in FIG. 21B, the position detector 11C makes the valid determination when the amount of change in the to-be-detected object becomes "2" or more, as in FIG. 21A, when the to-be-detected object moves at the up-and-down position P1 by an amount corresponding to the amount of movement indicated by arrow YB1, as illustrated in FIG. 21B, the position detector 11C makes the valid determination, and when the to-be-detected object moves at the up-and-down position P2 by an amount corresponding to the amount of movement indicated by arrow YB2, the position detector 11C makes the valid determination. As is apparent from comparison between arrow YB1 and arrow YB2, the amount of movement for the valid determination to be made with respect to the up-and-down position P1 and the amount of movement for the valid determination to be made with respect to the up-and-down position P2 become approximately equal to each other.

Figure 22:
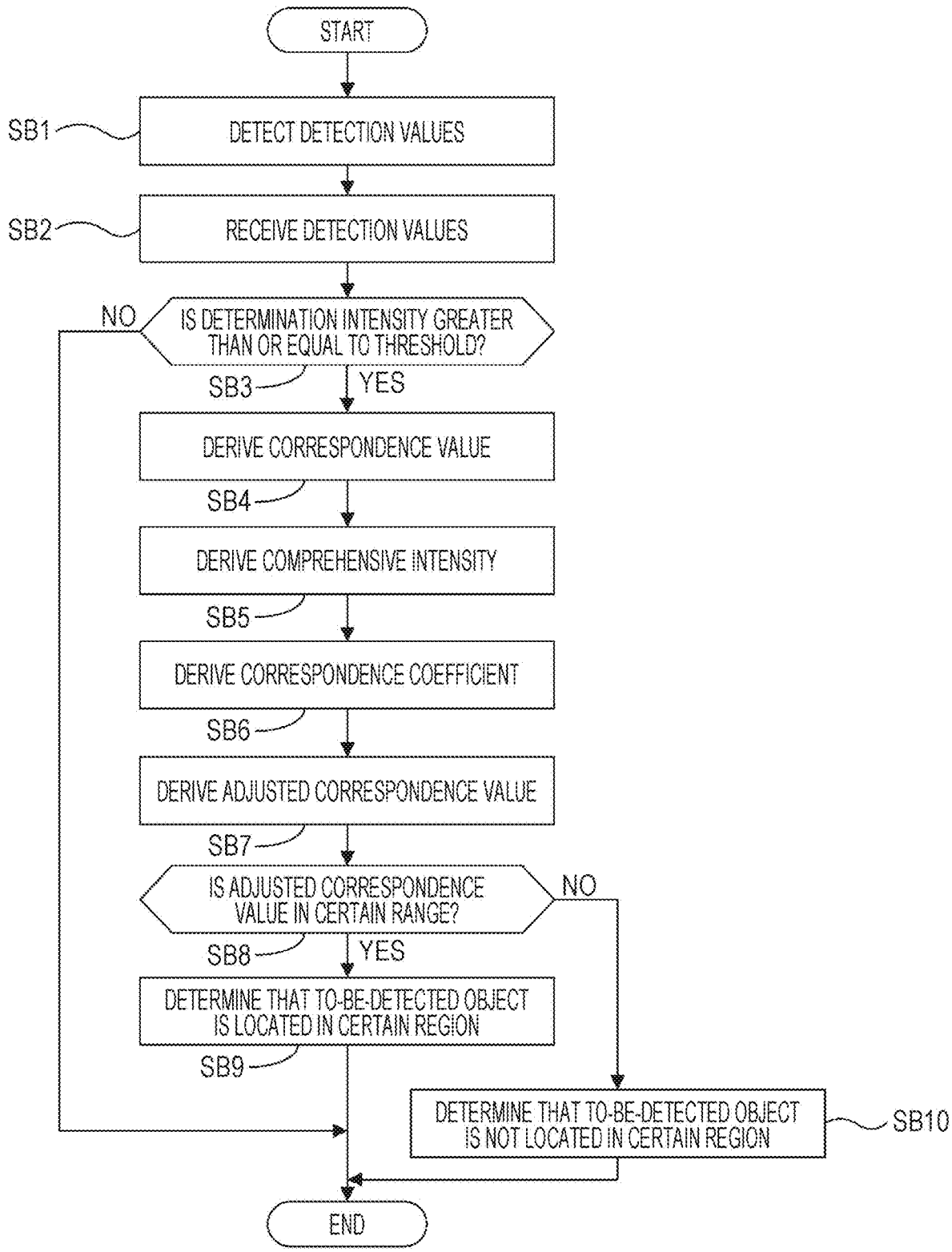
FIG. 22 is a flowchart illustrating an operation example of the electrostatic-capacitive proximity detecting device according to the fourth embodiment.

Next, operations of the electrostatic-capacitive proximity detecting device 3C will be described with reference to a flowchart. FIG. 22 is a flowchart illustrating operations that the electrostatic-capacitive proximity detecting device 3C executes in one cycle. In particular, FIG. 22 illustrates operations of the electrostatic-capacitive proximity detecting device 3C in the first example described above. As illustrated in FIG. 22, the electrostatic capacitance detector 10 drives the electrodes D1 to D5 in a time division manner, detects detection values corresponding to electrostatic capacitances between the to-be-detected object and the respective electrodes D1 to D5, and outputs the detection values to the position detector 11C (step SB1).

The position detector 11C receives the detection values for the electrodes D from the electrostatic capacitance detector 10 (step SB2). Then, the position detector 11C derives the determination intensity and determines whether or not the determination intensity is greater than or equal to a threshold (step SB3). When the determination intensity is smaller than the threshold (NO in step SB3), the position detector 11C ends the processing. When the determination intensity is greater than or equal to the threshold (YES in step SB3), the position detector 11C derives the correspondence value N by using the calculation expression S1 (step SB4). Then, the position detector 11C derives the comprehensive intensity EL by using the calculation expression S2 (step SB5). Then, the position detector 11C derives the correspondence coefficient K, based on the comprehensive intensity EL (step SB6). Then, the position detector 11C derives the adjusted correspondence value N' by using the calculation expression S3 to which the correspondence coefficient K derived in step SB6 is applied (step SB7).

Then, the position detector 11C determines whether or not the adjusted correspondence value N' derived in step SB7 is in a predetermined certain range (step SB8). When the adjusted correspondence value N' is in the certain range (YES in step SB8), the position detector 11C determines that the to-be-detected object is located in a certain region in the left-and-right direction (step SB9). When the adjusted correspondence value N' is not in the certain range (NO in step SB8), the position detector 11C determines that the to-be-detected object is not located in the certain region in the left-and-right direction (step SB10).

Modification of Fourth Embodiment

Next, a modification of a fourth embodiment will be described. In the fourth embodiment, the comprehensive intensity EL is a value that is derived by totaling the detection values for the electrodes D. In this respect, the position detector 11C may be configured to derive the comprehensive intensity EL by using another method. In one example, the position detector 11C may be configured to use the largest value of the detection values for the electrodes D1, D2, D3, D4, and D5 as the comprehensive intensity EL. That is, the comprehensive intensity EL is an overall intensity of the detection values for the electrodes D and may have any value that can serve as an indication value indicating the degree of the amount of spacing between the electrode unit 4 and the to-be-detected object. The above description also applies to other embodiments in which the comprehensive intensity EL and an indication value corresponding thereto are derived.

In the fourth embodiment, the relationship between the correspondence coefficient K and the comprehensive intensity EL is defined by the tendency curve, as described above. In this respect, the relationship between the correspondence coefficient K and the comprehensive intensity EL may be defined by a method other than the method using the tendency curve, or the position detector 11C may be configured to derive the value of the correspondence coefficient K by using a method other than the method for deriving the value of the correspondence coefficient K by using the tendency curve. For example, the relationship between the correspondence coefficient K and the comprehensive intensity EL may be defined using a table, and the position detector 11C may be configured to derive the value of the correspondence coefficient K by using the table and based on the comprehensive intensity EL. Also, for example, the position detector 11C may be configured to define the value of the correspondence coefficient K by using a model in which the comprehensive intensity EL is an input and an appropriate value of the correspondence coefficient K is an output.

In addition, in the fourth embodiment, the position detector 11C derives the adjusted correspondence value N' by using the calculation expression S3, as described above. In this respect, the position detector 11C may be configured to use the adjusted correspondence value N' by using a method other than the method using the calculation expression S3. That is, the position detector 11C may adjust the correspondence value by reflecting the degree of the amount of displacement between the electrode-group center position and the position indicated by the correspondence value and may more strongly reflect the degree of the amount of displacement as the amount of spacing becomes larger.

The technology in the fourth embodiment and the technology in the second embodiment can also be combined together. Specifically, with respect to the correspondence value N derived for the electrodes DD in the second embodiment, the adjusted correspondence value N' may be derived using the method described in the fourth embodiment. The technology in the fourth embodiment and the technology in the third embodiment can also be combined together. Specifically, with respect to the correspondence value Nx derived using the calculation expression Sx in the third embodiment, the adjusted correspondence value N' may be derived using the method described in the fourth embodiment, and further, with respect to the correspondence value Ny derived using the calculation expression Sy, the adjusted correspondence value N' may be derived using the method described in the fourth embodiment.

Fifth Embodiment

Figure 23:
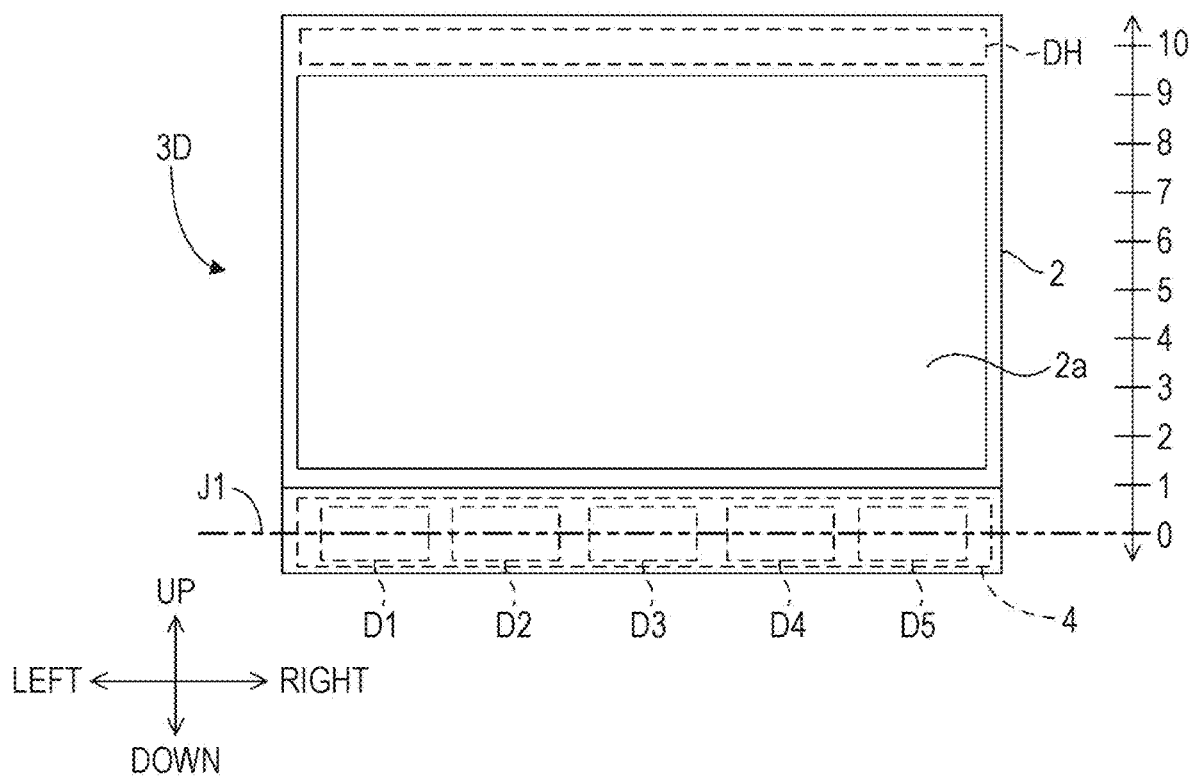
FIG. 23 is a front view of an in-vehicle apparatus according to a fifth embodiment.

Next, a fifth embodiment will be described. FIG. 23 is a simplified front view schematically illustrating an in-vehicle apparatus 1D according to the present embodiment. In the fifth embodiment described below, elements that are substantially the same as those in the first embodiment are denoted by the same reference numerals, and descriptions thereof are not given hereinafter.

As illustrated in FIG. 23, the in-vehicle apparatus 1D according to the present embodiment includes a display panel 2 and an electrostatic-capacitive proximity detecting device 3D. The electrostatic-capacitive proximity detecting device 3D includes an electrode unit 4 and an auxiliary electrode DH. The display panel 2 has a display screen 2a on which video is displayed, and the electrodes D in the electrode unit 4 are arranged outside the display screen 2a and along the left-and-right direction (one direction). The auxiliary electrode DH is provided at a position that opposes the electrode unit 4, with the display screen 2a being interposed therebetween.

Figure 24:
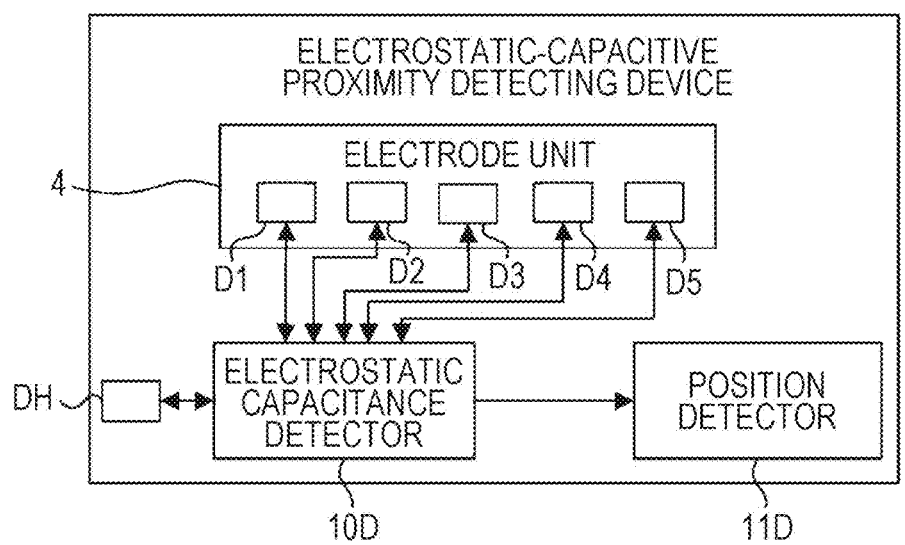
FIG. 24 is a block diagram illustrating a functional configuration example of an electrostatic-capacitive proximity detecting device according to the fifth embodiment.

FIG. 24 is a block diagram illustrating a functional configuration example of the electrostatic-capacitive proximity detecting device 3D. As illustrated in FIG. 24, the electrostatic-capacitive proximity detecting device 3D includes an electrostatic capacitance detector 10D, in place of the electrostatic capacitance detector 10 according to the first embodiment, and a position detector 11D, in place of the position detector 11 according to the first embodiment. The electrostatic capacitance detector 10D drives the electrodes D1 to D5 and the auxiliary electrode DH in each cycle in a time division manner, detects the detection values, and outputs the detection values to the position detector 11D.

In the present embodiment, rather than being notified that the to-be-detected object is to be placed at a position close to the electrode unit 4 for a contactless input, the person in the vehicle is notified in advance that the to-be-detected object is to be placed at a position that is directly in front of the electrode unit 4 and that is close to the electrode unit 4 or at a position that is directly in front of the display screen 2a and that is close to the display screen 2a for the contactless input, as in the fourth embodiment. Accordingly, it is assumed that during the contactless input, the to-be-detected object is located at a position that is directly in front of the electrode unit 4 and that is close to the electrode unit 4 or at a position that is directly in front of the display screen 2a and that is close to the display screen 2a. In this case, the amount of spacing between the electrode unit 4 and the to-be-detected object increases as the to-be-detected object moves upward from the position directly in front of the electrode unit 4, and additionally, the degree of the amount of spacing between the electrode unit 4 and the to-be-detected object can be determined based on to what degree the to-be-detected object is present upward from the position directly in front of the electrode unit 4 (i.e., based on the up-and-down position of the to-be-detected object).

The position detector 11D executes processing below in each cycle. That is, the position detector 11D receives the detection values for the electrodes D1 to D5 and the auxiliary electrode DH. Next, based on the detection values for the electrodes D1 to D5, the position detector 11D derives the correspondence value N by using the calculation expression S1. In addition, the position detector 11D derives the comprehensive intensity EL, based on the detection values for the electrodes D1 to D5. As in the fourth embodiment, the position detector 11D derives the comprehensive intensity EL by totaling the detection values for the electrodes D1 to D5.

Then, the position detector 11D derives an estimated up-and-down position value, based on the detection value for the auxiliary electrode DH and the comprehensive intensity EL. In the present embodiment, up-and-down position values are defined as values indicating up-and-down positions. As illustrated in FIG. 23, the up-and-down position values are defined so that a value indicating the up-and-down position on the axis J1 is "0", and the value increases as the position moves upward. The estimated up-and-down position value is an up-and-down position value indicating a position that is estimated to be the up-and-down position of the to-be-detected object. As described above, in the present embodiment, the amount of spacing between the electrode unit 4 and the to-be-detected object increases as the to-be-detected object moves upward from a position directly in front of the electrode unit 4, and additionally, the degree of the amount of spacing between the electrode unit 4 and the to-be-detected object can be determined based on the up-and-down position of the electrode unit 4. Accordingly, the up-and-down position value can be used as an indication value indicating the degree of the amount of spacing between the electrode unit 4 and the to-be-detected object.

The position detector 11D derives the estimated up-and-down position value by using a calculation expression including at least the detection value for the auxiliary electrode DH and the comprehensive intensity EL as parameters. The calculation expression for deriving the estimated up-and-down position value is derived based on prior testing or simulation. For example, a considerable number of pieces of data, each piece including a certain up-and-down position value indicating the up-and-down position of the to-be-detected object for a certain value of the auxiliary electrode DH and a certain value of the comprehensive intensity EL, are accumulated through prior testing, and regression analysis is performed on the accumulated pieces of data to thereby derive the calculation expression.

The position detector 11D may derive the up-and-down position value by using a method below. That is, the to-be-detected object is assumed to be present at a position that is included in a range between the electrode unit 4 and the electrode DH in the up-and-down direction and that corresponds to the ratio of the detection value for the electrode DH to the value of the comprehensive intensity EL, and the position detector 11D derives the up-and-down position value of the to-be-detected object by using the ratio of the detection value for the electrode DH to the value of the comprehensive intensity EL. In this case, the position detector 11D adjusts the ratio of the detection value for the electrode DH to the value of the comprehensive intensity EL, based on the strength/weakness of the intensity of an electric field formed by the electrode DH and the intensity of an electric field formed by the electrode unit 4. In general, since the display panel 2 has a narrower frame portion at the upper portion than at the lower portion, there are cases in which the electrode DH becomes smaller than the electrodes D. Thus, when the electrode DH is small, the intensity of the electric field formed by the electrode DH is low.

After deriving the estimated up-and-down position value, the position detector 11D derives the correspondence coefficient K in the calculation expression S3, based on the estimated up-and-down position value. More specifically, the estimated up-and-down position value can be used as an indication value indicating the degree of the amount of spacing between the to-be-detected object and the electrode unit 4. Hence, in the present embodiment, the relationship between the correspondence coefficient K, which is used in the calculation expression S3, and the estimated up-and-down position value is pre-determined based on prior testing or simulation, as in the fourth embodiment described above.

In the present embodiment, the relationship between the correspondence coefficient K and the estimated up-and-down position value is represented as a tendency curve, as in the fourth embodiment.

By using the tendency curve indicating the relationship between the correspondence coefficient K and the estimated up-and-down position value, the position detector 11D derives the correspondence coefficient K corresponding to the derived estimated up-and-down position value. Then, the position detector 11D derives the adjusted correspondence value N' by using the calculation expression S3 into which the derived correspondence coefficient K is reflected. The accuracy of the adjusted correspondence value N' derived in the manner described above is high, as in the fourth embodiment.

According to the present embodiment, the estimated up-and-down position value can be highly accurately derived by using the auxiliary electrode DH provided at a position that opposes the electrode units D, with the display screen 2a being interposed therebetween. Being able to highly accurately derive the estimated up-and-down position value means that the amount of spacing between the to-be-detected object and the electrode unit 4 can be highly accurately derived, thus making it possible to enhance the accuracy of the value of the adjusted correspondence value N' to be eventually derived.

Figure 25:
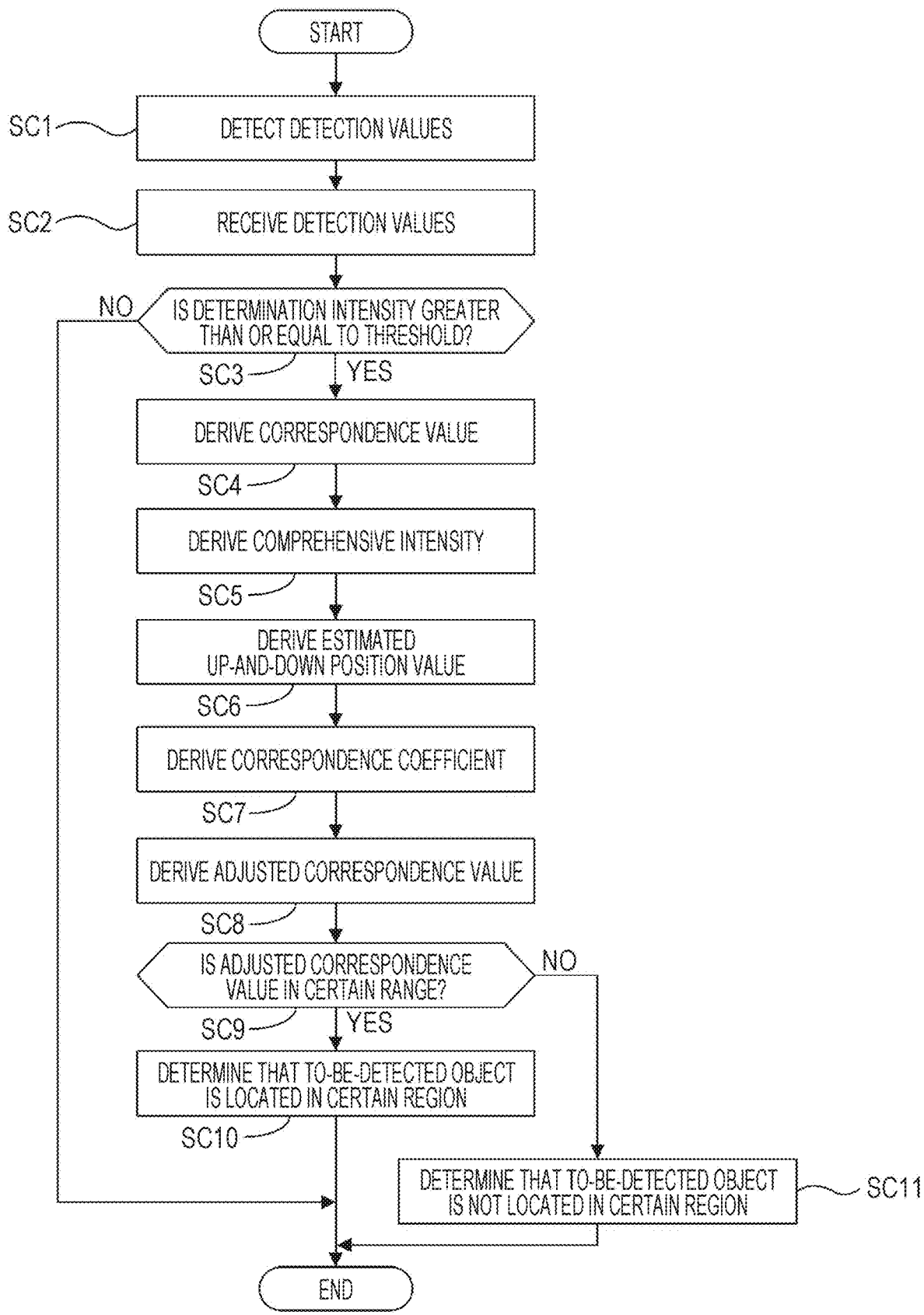
FIG. 25 is a flowchart illustrating an operation example of the electrostatic-capacitive proximity detecting device according to the fifth embodiment.

Next, operations of the electrostatic-capacitive proximity detecting device 3D will be described with reference to a flowchart. FIG. 25 is a flowchart illustrating operations that the electrostatic-capacitive proximity detecting device 3D executes in one cycle. In particular, FIG. 25 illustrates operations of the electrostatic-capacitive proximity detecting device 3D in the first example described above. As illustrated in FIG. 25, the electrostatic capacitance detector 10D drives the electrodes D1 to D5 and DH in a time division manner, detects detection values corresponding to electrostatic capacitances between the to-be-detected object and the respective electrodes D1 to D5 and DH, and outputs the detection values to the position detector 11D (step SC1).

The position detector 11D receives the detection values for the electrodes D and the detection value for the auxiliary electrode DH from the electrostatic capacitance detector 10 (step SC2). Then, the position detector 11D derives the determination intensity and determines whether or not the determination intensity is greater than or equal to a threshold (step SC3). When the determination intensity is smaller than the threshold (NO in step SC3), the position detector 11D ends the processing. When the determination intensity is greater than or equal to the threshold (YES in step SC3), the position detector 11D derives the correspondence value N by using the calculation expression S1 (step SC4). Then, the position detector 11D derives the comprehensive intensity EL by using the calculation expression S2 (step SC5). Then, based on the detection value for the auxiliary electrode DH, the detection value being received in step SC2, and the comprehensive intensity EL derived in step SC5, the position detector 11D derives the estimated up-and-down position value (step SC6). Then, based on the estimated up-and-down position value derived in step SC6, the position detector 11D derives the correspondence coefficient K (step SC7). Then, by using the calculation expression S3 to which the correspondence coefficient K derived in step SC7 is applied, the position detector 11D derives the adjusted correspondence value N' (step SC8).

Then, the position detector 11D determines whether or not the adjusted correspondence value N' derived in step SC8 is in a predetermined certain range (step SC9). When the adjusted correspondence value N' is in the certain range (YES in step SC9), the position detector 11D determines that the to-be-detected object is located in a certain region in the left-and-right direction (step SC10). When the adjusted correspondence value N' is not in the certain range (NO in step SC9), the position detector 11D determines that the to-be-detected object is not located in the certain region in the left-and-right direction (step SC11).

Sixth Embodiment

Figure 26:
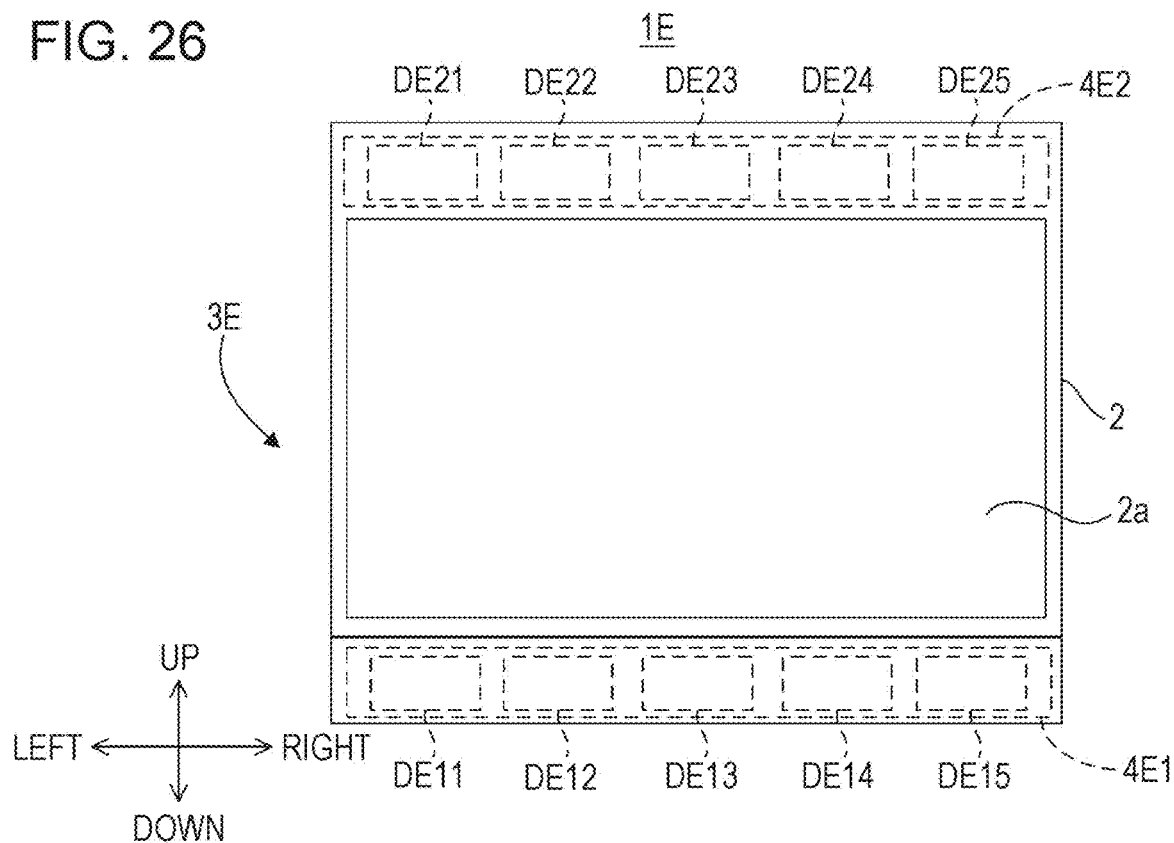
FIG. 26 is a front view of an in-vehicle apparatus according to a sixth embodiment.

Next, a sixth embodiment will be described. FIG. 26 is a simplified front view schematically illustrating an in-vehicle apparatus 1E according to the present embodiment. In the sixth embodiment described below, elements that are substantially the same as those in the first embodiment are denoted by the same reference numerals, and descriptions thereof are not given hereinafter.

As illustrated in FIG. 26, the in-vehicle apparatus 1E according to the present embodiment includes a display panel 2, which has a display screen 2a, and an electrostatic-capacitive proximity detecting device 3E. The electrostatic-capacitive proximity detecting device 3E includes a first electrode unit 4E1 and a second electrode unit 4E2. The first electrode unit 4E1 includes electrodes DE11 to DE15 provided below (outside) the display screen 2a and along the left-and-right direction (one direction). The second electrode unit 4E2 is provided at a position that opposes the first electrode unit 4E1, with the display screen 2a being interposed therebetween, that is, is provided above the display screen 2a. The second electrode unit 4E2 includes electrodes DE21 to DE25 provided above (outside) the display screen 2a and along the left-and-right direction (one direction). In the description below, the electrodes DE11 to DE15 and DE21 to DE25 may be referred to as "electrodes DE" when they are not distinguished therebetween.

In the present embodiment, rather than being notified that the to-be-detected object is to be placed at a position close to the first electrode unit 4E1 or the second electrode unit 4E2 for a contactless input, the person in the vehicle is notified in advance that the to-be-detected object is to be placed at a position that is directly in front of the first electrode unit 4E1 and the second electrode unit 4E2 and that is close to the electrode units 4E1 and 4E2 or at a position that is directly in front of the display screen 2a and that is close to the display screen 2a, as in the fourth embodiment and the fifth embodiment. Accordingly, it is assumed that during the contactless input, the to-be-detected object is located at a position that is directly in front of the first electrode unit 4E1 or the second electrode unit 4E2 and that is close thereto or a position that is directly in front of the display screen 2a and that is close to the display screen 2a.

Figure 27:
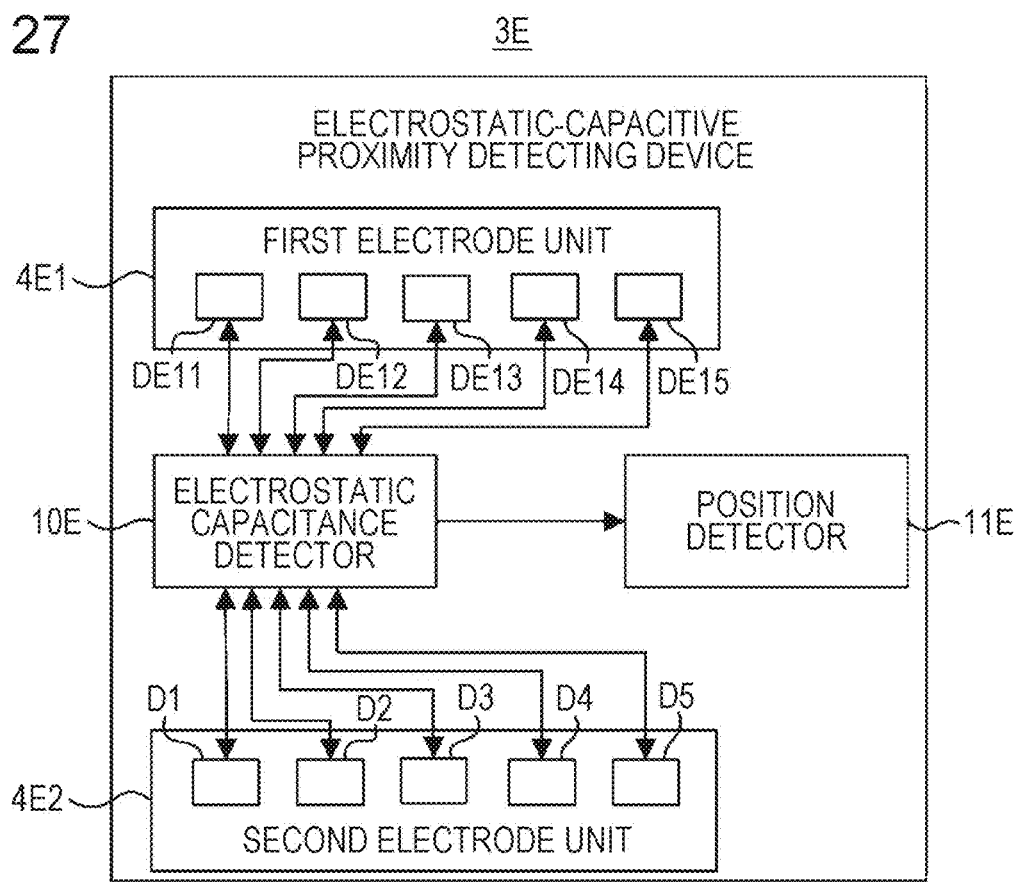
FIG. 27 is a block diagram illustrating a functional configuration example of an electrostatic-capacitive proximity detecting device according to a sixth embodiment.

FIG. 27 is a block diagram illustrating a functional configuration example of the electrostatic-capacitive proximity detecting device 3E. As illustrated in FIG. 27, the electrostatic-capacitive proximity detecting device 3E includes an electrostatic capacitance detector 10E, in place of the electrostatic capacitance detector 10 according to the first embodiment, and a position detector 11E, in place of the position detector 11 according to the first embodiment. In each cycle, the electrostatic capacitance detector 10E drives the electrodes DE11 to DE15 and DE21 to DE25 in a time division manner, detects the detection values, and outputs the detection values to the position detector 11E.

The position detector 11E executes processing below in each cycle. That is, the position detector 11E receives the detection values for the respective electrodes DE. Then, the position detector 11E derives a first comprehensive intensity EL1, based on the detection values for the electrodes DE11 to DE15 in the first electrode unit 4E1. The position detector 1E derives the first comprehensive intensity EL1 by totaling the detection values for the electrodes DE11 to DE15, as in the case in which the comprehensive intensity EL is derived in the fourth embodiment. In addition, the position detector 11D derives a second comprehensive intensity EL2, based on the detection values for the electrodes DE21 to DE25 in the second electrode unit 4E2. The position detector 11E derives the second comprehensive intensity EL2 by totaling the detection values for the electrodes DE21 to DE25, as in the case in which the second comprehensive intensity EL2 is derived in the fourth embodiment. Processing for deriving the first comprehensive intensity EL1 and processing for deriving the second comprehensive intensity EL2 may be executed in random order and may be executed at the same time.

Thereafter, the position detector 11E compares the first comprehensive intensity EL1 with the second comprehensive intensity EL2. When the result of the comparison indicates a first case in which the first comprehensive intensity EL1 is sufficiently greater than the second comprehensive intensity EL2, the position detector 11E executes processing below. That is, the position detector 11E derives the correspondence value N, based on the detection values for the electrodes DE11 to DE15 in the first electrode unit 4E1 and by using the calculation expression S1, and also adjusts the correspondence value N to derive the adjusted correspondence value N', by using the calculation expression S3 into which the correspondence coefficient K corresponding to the first comprehensive intensity EL1 is reflected.

Herein, the case in which the first comprehensive intensity EL1 is sufficiently greater than the second comprehensive intensity EL2 is assumed to be a state in which when the to-be-detected object is present at a position very close to the first electrode unit 4E1, the adjusted correspondence value N' that the position detector 11E derives by using the first electrode unit 4E1 is approximately equal to the actual coordinate value. Based on whether or not such a state is occurring, the determination is made as to whether or not the first comprehensive intensity EL1 is sufficiently greater than the second comprehensive intensity EL2. For example, the position detector 11E derives the difference between the first comprehensive intensity EL1 and the second comprehensive intensity EL2, and when the derived difference exceeds a predetermined threshold, the position detector 11E determines that the first comprehensive intensity EL1 is sufficiently greater than the second comprehensive intensity EL2. This threshold is pre-determined based on prior testing or simulation, based on criteria for determining whether or not the above-described state is occurring.

On the other hand, when the result of the comparison between the first comprehensive intensity EL1 and the second comprehensive intensity EL2 indicates a second case in which the second comprehensive intensity EL2 is sufficiently greater than the first comprehensive intensity EL1, the position detector 11E derives the correspondence value N, based on the detection values for the electrodes DE21 to DE25 in the second electrode unit 4E2 and by using the calculation expression S1, and also adjusts the correspondence value N to derive the adjusted correspondence value N', by using the calculation expression S3 into which the correspondence coefficient K corresponding to the second comprehensive intensity EL2 is reflected.

Herein, the case in which the second comprehensive intensity EL2 is sufficiently greater than the first comprehensive intensity EL1 is assumed to be a state in which when the to-be-detected object is present at a position significantly close to the second electrode unit 4E2, and the position detector 11E derives the adjusted correspondence value N' by using the second electrode unit 4E2, the derived adjusted correspondence value N' is approximately equal to the actual coordinate value. Based on whether or not such a state is occurring, the determination as to whether or not the second comprehensive intensity EL2 is sufficiently greater than the first comprehensive intensity EL1 is made by using a method that is similar to the method in the first case.

Also, when the result of the comparison between the first comprehensive intensity EL1 and the second comprehensive intensity EL2 indicates a third case that is neither the first case nor the second case, the position detector 11E executes correspondence-value-related processing. That is, the position detector 11E derives the correspondence value N (corresponding to a "first correspondence value") in accordance with the calculation expression S1 by using the first electrode unit 4E1 and also derives the adjusted correspondence value N' by adjusting the correspondence value N in accordance with the calculation expression S3. The adjusted correspondence value N' derived using the first electrode unit 4E1 will hereinafter be referred to as a "first adjusted correspondence value N1" (corresponding to an "adjusted first correspondence value"). In addition, the position detector 11E derives the correspondence value N (corresponding to a "second correspondence value") in accordance with the calculation expression S1 by using the second electrode unit 4E2 and also derives the adjusted correspondence value N' by adjusting the correspondence value N in accordance with the calculation expression S3. The adjusted correspondence value N' derived using the second electrode unit 4E2 will hereinafter be referred to as a "second adjusted correspondence value N2" (corresponding to an "adjusted second correspondence value").

Then, the position detector 11E derives a final adjusted correspondence value NN by using calculation expression S4 below:

$$NN=(EL1*N1+EL2*N2)/(EL1+EL2)$$

where EL1 represents the first comprehensive intensity, EL2 represents the second comprehensive intensity, N1 represents the first adjusted correspondence value, and N2 represents the second adjusted correspondence value.

The calculation expression S4 is an expression for deriving the final adjusted correspondence value NN (corresponding to a "third correspondence value") by performing weighted averaging in which the first comprehensive intensity EL1 and the second comprehensive intensity EL2 are weights, and the first adjusted correspondence value N1 and the second adjusted correspondence value N2 are variables. That is, in the third case, the position detector 11E uses both the first adjusted correspondence value N1 and the second adjusted correspondence value N2 to derive the final adjusted correspondence value NN, based on the ratio of the first comprehensive intensity EL1 to the second comprehensive intensity EL2, that is, the ratio of "proximity of the to-be-detected object and the first electrode unit 4E1" to "proximity of the to-be-detected object and the second electrode unit 4E2". This makes it possible to derive a high-accuracy final adjusted correspondence value NN by preferably utilizing the feature that the first electrode unit 4E1 and the second electrode unit 4E2 are provided at positions that oppose each other with the display screen 2a being interposed therebetween and the feature that the accuracy of the adjusted correspondence value N' becomes higher as the to-be-detected object gets closer to the electrode unit (the first electrode unit 4E1 or the second electrode unit 4E2). The position detector 11E detects the final adjusted correspondence value NN as the position of the to-be-detected object in the left-and-right direction.

Figure 28:
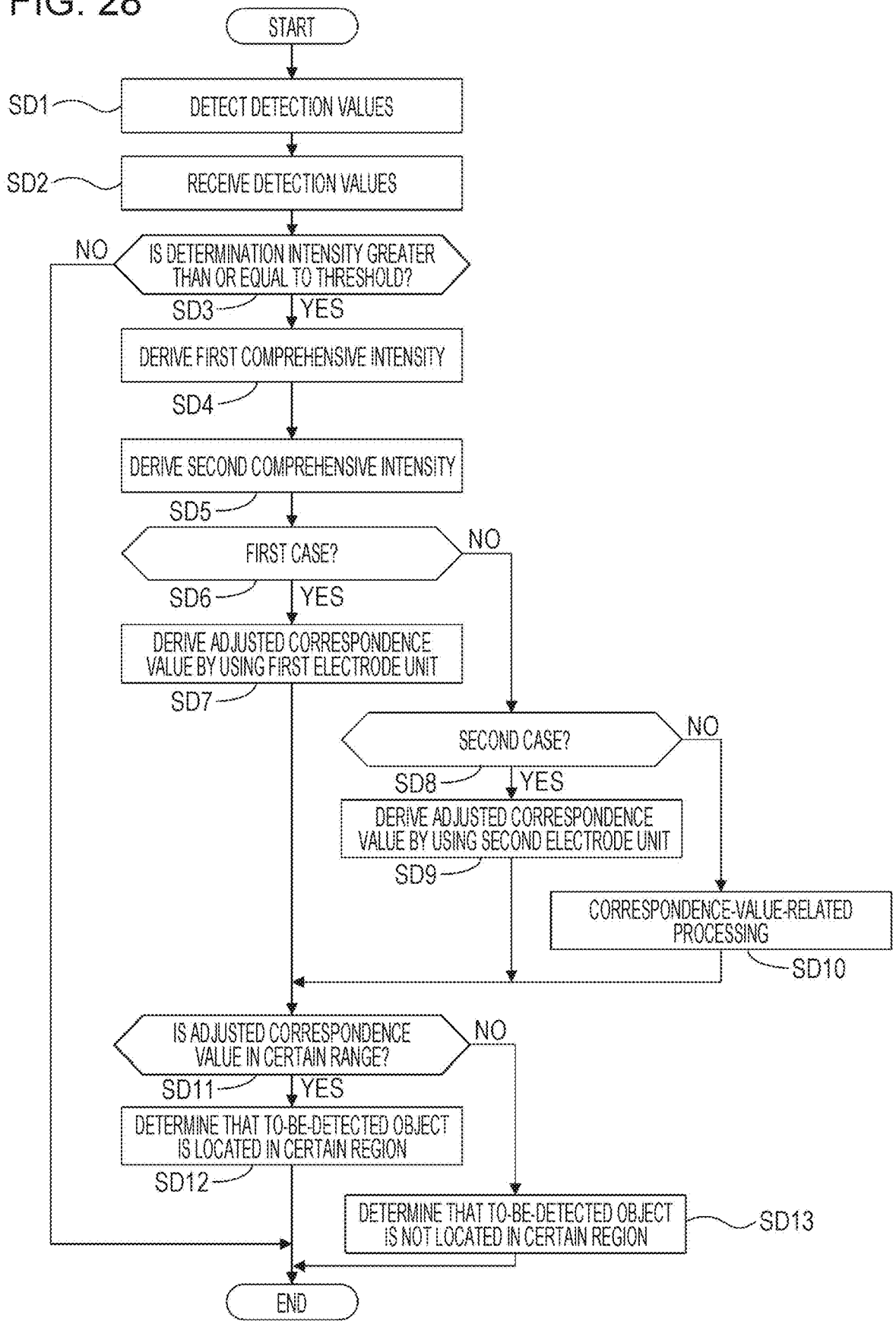
FIG. 28 is a flowchart illustrating an operation example of the electrostatic-capacitive proximity detecting device according to the sixth embodiment.

Next, operations of the electrostatic-capacitive proximity detecting device 3E will be described with reference to a flowchart. FIG. 28 is a flowchart illustrating operations that the electrostatic-capacitive proximity detecting device 3E executes in one cycle. In particular, FIG. 28 illustrates operations of the electrostatic-capacitive proximity detecting device 3E in the first example described above. As illustrated in FIG. 28, the electrostatic capacitance detector 10D drives the electrodes DE11 to DE15 and DE21 to DE25 in a time division manner, detects detection values corresponding to electrostatic capacitances between the to-be-detected object and the respective electrodes DE11 to DE15 and DE21 to DE25, and outputs the detection values to the position detector 11E (step SD1).

The position detector 11E receives the detection values for the respective electrodes DE from the electrostatic capacitance detector 10 (step SD2). Then, the position detector 11E derives the determination intensity and determines whether or not the determination intensity is greater than or equal to a threshold (step SD3). When the determination intensity is smaller than the threshold (NO in step SD3), the position detector 11E ends the processing. When the determination intensity is greater than or equal to the threshold (YES in step SD3), the position detector 11E derives the first comprehensive intensity EL1, based on the detection values for the electrodes DE11 to DE15 in the first electrode unit 4E1 (step SD4). Then, the position detector 11E derives the second comprehensive intensity EL2, based on the detection values for the electrodes DE21 to DE25 in the second electrode unit 4E2 (step SD5).

Then, the position detector 11E determines whether or not the current state corresponds to the first case in which the first comprehensive intensity EL1 is sufficiently greater than the second comprehensive intensity EL2 (step SD6). When the current state corresponds to the first case (YES in step SD6), the position detector 11E derives the correspondence value N, based on the detection values for the electrodes DE11 to DE15 in the first electrode unit 4E1, and also derives the adjusted correspondence value N' by adjusting the correspondence value N (step SD7). After the processing in step SD7, the process proceeds to step SD11.

When the current state does not correspond to the first case (NO in step SD6), the position detector 11E determines whether or not the current state corresponds to the second case in which the second comprehensive intensity EL2 is sufficiently greater than the first comprehensive intensity EL1 (step SD8). When the current state corresponds to the second case (YES in step SD8), the position detector 11E derives the correspondence value N, based on the detection values for the electrodes DE21 to DE25 in the second electrode unit 4E2, and also derives the adjusted correspondence value N' by adjusting the correspondence value N (step SD9). After the processing in step SD9, the process proceeds to step SD11.

When the current state does not correspond to the second case (i.e., the current state corresponds to the third case) (NO in step SD8), the position detector 11E executes correspondence-value-related processing (step SD10). In this correspondence-value-related processing, the position detector 11E derives the first adjusted correspondence value N1 by using the first electrode unit 4E1. In addition, the position detector 11E derives the second adjusted correspondence value N2 by using the second electrode unit 4E2. Then, the position detector 11E derives the final adjusted correspondence value NN by using the calculation expression S4. After the processing in step SD10, the process proceeds to step SD11.

In step SD11, the position detector 11E determines whether or not the adjusted correspondence value N' derived in step SD7, the adjusted correspondence value N' derived in step SD9, or the final adjusted correspondence value NN derived in step SD11 is in a predetermined certain range (step SD11). When the adjusted correspondence value N' or the final adjusted correspondence value NN is in the certain range (YES in step SD11), the position detector 11E determines that the to-be-detected object is located in a certain region in the left-and-right direction (step SD12). When the adjusted correspondence value N' or the final adjusted correspondence value NN is not in the certain range (NO in step SD11), the position detector 11E determines that the to-be-detected object is not located in the certain region in the left-and-right direction (step SD13).

Modification of Sixth Embodiment

Next, a modification of the sixth embodiment will be described. In the sixth embodiment described above, in the third case, the position detector 11E derives the final adjusted correspondence value NN by using the calculation expression S4. However, a method for deriving the final adjusted correspondence value NN is not limited to the method using the calculation expression S4. That is, the final adjusted correspondence value NN may be any value that is derived based on the first adjusted correspondence value N1 and the second adjusted correspondence value N2. For example, the position detector 11E may derive, as the final adjusted correspondence value NN, an average value of the first adjusted correspondence value N1 and the second adjusted correspondence value N2 or a value derived using another statistical approach.

In the third case described above, the position detector 11E may execute processing below instead of the correspondence-value-related processing executed in the sixth embodiment. That is, when the comparison between the first comprehensive intensity EL1 and the second comprehensive intensity EL2 indicates that the first comprehensive intensity EL1 is greater than or equal to the second comprehensive intensity EL2, the position detector 11E derives the correspondence value N and the adjusted correspondence value N' by using the first electrode unit 4E1 and uses the adjusted correspondence value N' as the position of the to-be-detected object in the left-and-right direction. On the other hand, when the second comprehensive intensity EL2 is greater than the first comprehensive intensity EL1, the position detector I1E derives the correspondence value N and the adjusted correspondence value N' by using the second electrode unit 4E2 and uses the adjusted correspondence value N' as the position of the to-be-detected object in the left-and-right direction. According to this configuration, it is possible to highly accurately detect the position of the to-be-detected object by preferably utilizing the feature that the first electrode unit 4E1 and the second electrode unit 4E2 are located at positions that oppose each other with the display screen 2a being interposed therebetween and the feature that the accuracy of the adjusted correspondence value N' becomes higher as the to-be-detected object gets closer to the electrode unit (the first electrode unit 4E1 or the second electrode unit 4E2), Although embodiments of the present invention have been described above, the embodiments are merely specific examples, and the present invention can be implemented in various forms.

For example, in the first embodiment described above, all the surface areas of the electrodes D are the same. However, the surface areas of the electrodes D may differ from one another, for a reason, such as convenience of the design of the electrostatic-capacitive proximity detecting device 3. In this case, the position detector 11 adjusts the detection values detected by the electrostatic capacitance detector 10, depending on the surface areas of the electrodes D. The position detector 11 then uses the adjusted detection values as parameters in the calculation expression S1 to thereby derive the correspondence value N. The above description also applies to other embodiments (including modifications).

Although, in the first embodiment, the electrostatic-capacitive proximity detecting device 3 is applied to the in-vehicle apparatus 1 provided in a vehicle, an apparatus to which the electrostatic-capacitive proximity detecting device 3 is applied is not limited to an apparatus provided in a vehicle. This also applies to other embodiments (including modifications).

In addition, in the first embodiment, the position detector 11 derives the correspondence value N by using the calculation expression S1, to thereby detect the position of the to-be-detected object in the left-and-right direction. However, the method for the position detector 11 to detect the position of the to-be-detected object in the left-and-right direction is not limited to the method exemplified in the first embodiment. That is, any method for detecting the position of the to-be-detected object in the left-and-right direction on the basis of the arrangement positions of the electrodes D and a bias in the magnitudes of the detection values for the electrodes D may be used, based on the characteristic that the detection values detected at the respective electrodes D have a bias in a form corresponding to the position of the to-be-detected object in the left-and-right direction. For example, a value indicating the position of the to-be-detected object in the left-and-right direction may be derived by using a calculation expression using a statistical approach other than the method using the weighted averaging, and the position of the to-be-detected object in the left-and-right direction may be detected based on the derived value. This also applies to other embodiments (including modifications).

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An electrostatic-capacitive proximity detecting device for detecting proximity of a to-be-detected object, the electrostatic-capacitive proximity detecting device comprising:
an electrode unit including a plurality of electrodes linearly arranged along one direction;

an electrostatic capacitance detector configured to drive the electrodes in a time division manner and to detect detection values corresponding to electrostatic capacitances between the to-be-detected object and the respective electrodes; and a position detector configured to detect a position of the to-be-detected object in the direction, based on arrangement positions of the respective electrodes in the direction and a bias in magnitudes of the detection values detected for the respective electrodes by the electrostatic capacitance detector;

wherein the plurality of electrodes included in the electrode unit comprises electrodes linearly arranged along a first direction and electrodes linearly arranged along a second direction orthogonal to the first direction, the electrodes linearly arranged along the first direction and the electrodes linearly arranged along the second direction being arrayed in a matrix;

wherein the electrodes linearly arranged along the first direction are grouped into first groups that each function as one electrode, the electrodes linearly arranged along the second direction are grouped into second groups that each function as one electrode, and the electrostatic capacitance detector is configured to drive the first groups and the second groups in a time division manner and to detect detection values for the respective first groups and second groups; and wherein the position detector is further configured to:
detect a position of the to-be-detected object in the second direction, based on arrangement positions of the respective first groups in the second direction and a bias in magnitudes of the detection values detected for the respective first groups by the electrostatic capacitance detector, and detect a position of the to-be-detected object in the first direction, based on arrangement positions of the respective second groups in the first direction and a bias in magnitudes of the detection values detected for the respective second groups by the electrostatic capacitance detector.

2. The electrostatic-capacitive proximity detecting device according to claim 1,
wherein the position detector derives a correspondence value indicating the position of the to-be-detected object in the direction, by performing calculation for deriving the correspondence value by using the arrangement positions of the respective electrodes in the direction and the magnitudes of the detection values for the respective electrodes and reflecting the bias in the magnitudes of the detection values for the respective electrodes.

3. The electrostatic-capacitive proximity detecting device according to claim 2,
wherein the position detector derives the correspondence value by performing weighted averaging in which the detection values for the respective electrodes are weights, and the positions of the electrodes in the direction are variables.

4. The electrostatic-capacitive proximity detecting device according to claim 3,
wherein the position detector determines whether or not the correspondence value is in a certain range, and when the correspondence value is in the certain range, the position detector determines that the to-be-detected object is located in a certain region in the direction.

5. The electrostatic-capacitive proximity detecting device according to claim 3,
wherein the position detector monitors whether or not an amount of change in the correspondence value is larger than or equal to a reference amount, and when the amount of change is larger than or equal to the reference amount, the position detector performs a valid determination.

6. An electrostatic-capacitive proximity detecting device for detecting proximity of a to-be-detected object, the electrostatic-capacitive proximity detecting device comprising:
an electrode unit including a plurality of electrodes linearly arranged along one direction;

an electrostatic capacitance detector configured to drive the electrodes in a time division manner and to detect detection values corresponding to electrostatic capacitances between the to-be-detected object and the respective electrodes; and a position detector configured to detect a position of the to-be-detected object in the direction, based on arrangement positions of the respective electrodes in the direction and a bias in magnitudes of the detection values detected for the respective electrodes by the electrostatic capacitance detector wherein the position detector is configured to determine whether or not the correspondence value is in a certain range, and when the correspondence value is in the certain range, the position detector is configured to determine that the to-be-detected object is located in a certain region in the direction;

wherein the position detector is further configured to
recognize a degree of an amount of spacing between the electrode unit and the to-be-detected object, and adjust the correspondence value by reflecting a degree of an amount of displacement between an electrode-group center position that is a position of, in the direction, a center portion of a region where the electrodes in the electrode unit are arranged and a position indicated by the correspondence value, and during the adjustment of the correspondence value, the position detector more strongly reflects the degree of the amount of displacement as the amount of spacing becomes larger, wherein the position detector is configured to adjust the correspondence value by adding a value, derived by multiplying a value obtained by subtracting a value indicating the electrode-group center position from the correspondence value by a coefficient, to the correspondence value, and during the adjustment of the correspondence value, the position detector increases the coefficient as the amount of spacing increases.

7. The electrostatic-capacitive proximity detecting device according to claim 6,
wherein the position detector derives a comprehensive intensity, based on a detection result of the electrostatic capacitance detector, the comprehensive intensity being an overall intensity of the detection values for the electrodes, and recognizes the degree of the amount of spacing, based on the derived comprehensive intensity.

8. The electrostatic-capacitive proximity detecting device according to claim 6,
wherein the electrodes in the electrode unit are arranged outside a display screen of a display panel and along the direction, and an auxiliary electrode is provided at a position that opposes the electrode unit, with the display screen being interposed therebetween;

the electrostatic capacitance detector drives the auxiliary electrode and detects a detection value corresponding to an electrostatic capacitance between the to-be-detected object and the auxiliary electrode; and the position detector derives a comprehensive intensity, based on a detection result of the electrostatic capacitance detector, the comprehensive intensity being an overall intensity of the detection values for the electrodes, and recognizes the degree of the amount of spacing, based on the derived comprehensive intensity and a magnitude of the detection value for the auxiliary electrode, the detection value being detected by the electrostatic capacitance detector.

9. The electrostatic-capacitive proximity detecting device according to claim 6, wherein the electrode unit comprises a first electrode unit and a second electrode unit, the first electrode unit including the electrodes arranged outside a display screen and along the direction, and the second electrode unit including the electrodes arranged at a position that opposes the first electrode unit, with the display screen being interposed therebetween, and along the direction; and wherein the position detector derives a first comprehensive intensity and a second comprehensive intensity, based on a detection result of the electrostatic capacitance detector, the first comprehensive intensity being an overall intensity of detection values for the electrodes in the first electrode unit, and the second comprehensive intensity being an overall intensity of detection values for the electrodes in the second electrode unit;

in a first case in which the first comprehensive intensity is sufficiently greater than the second comprehensive intensity, the position detector derives and adjusts the correspondence value by using the first electrode unit and detects the position of the to-be-detected object in the direction, based on the correspondence value;

in a second case in which the second comprehensive intensity is sufficiently greater than the first comprehensive intensity, the position detector derives and adjusts the correspondence value by using the second electrode unit and detects the position of the to-be-detected object in the direction, based on the correspondence value; and in a third case that is neither the first case nor the second case, the position detector executes correspondence-value-related processing for deriving and adjusting a first correspondence value by using the first electrode unit, for deriving and adjusting a second correspondence value by using the second electrode unit, and for detecting the position of the to-be-detected object in the direction, based on the adjusted first correspondence value and the adjusted second correspondence value.

10. The electrostatic-capacitive proximity detecting device according to claim 9, wherein in the third case, the position detector executes the correspondence-value-related processing for deriving a third correspondence value indicating the position of the to-be-detected object in the direction by performing weighted averaging in which the first comprehensive intensity and the second comprehensive intensity are weights, and the adjusted first correspondence value and the adjusted second correspondence value are variables.

11. The electrostatic-capacitive proximity detecting device according to claim 6, wherein the electrode unit comprises a first electrode unit and a second electrode unit, the first electrode unit including the electrodes arranged outside a display screen and along the direction, and the second electrode unit including the electrodes arranged at a position that opposes the first electrode unit, with the display screen being interposed therebetween, and along the direction; and wherein the position detector derives a first comprehensive intensity and a second comprehensive intensity, based on a detection result of the electrostatic capacitance detector, the first comprehensive intensity being an overall intensity of detection values for the electrodes in the first electrode unit, and the second comprehensive intensity being an overall intensity of detection values for the electrodes in the second electrode unit;

in a first case in which the first comprehensive intensity is sufficiently greater than the second comprehensive intensity, the position detector derives and adjusts the correspondence value by using the first electrode unit and detects the position of the to-be-detected object in the direction, based on the correspondence value;

in a second case in which the second comprehensive intensity is sufficiently greater than the first comprehensive intensity, the position detector derives and adjusts the correspondence value by using the second electrode unit and detects the position of the to-be-detected object in the direction, based on the correspondence value; and in a third case that is neither the first case nor the second case, the position detector executes processing for comparing the first comprehensive intensity with the second comprehensive intensity, for deriving and adjusting a first correspondence value when the first comprehensive intensity is greater than or equal to the second comprehensive intensity and using the adjusted first correspondence value as the position of the to-be-detected object in the direction, and for deriving and adjusting a second correspondence value when the second comprehensive intensity is greater than the first comprehensive intensity and using the adjusted second correspondence value as the position of the to-be-detected object in the direction.

12. The electrostatic-capacitive proximity detecting device according to claim 11, wherein surface areas of two or more of the electrodes are different from each other, and in accordance with the surface areas of the electrodes, the position detector adjusts the detection values detected for the electrodes by the electrostatic capacitance detector.

13. A method for detecting a position of a to-be-detected object, the detection being performed by an electrostatic-capacitive proximity detecting device including an electrode unit including a plurality of electrodes linearly arranged along one direction, the method comprising:

causing an electrostatic capacitance detector in the electrostatic-capacitive proximity detecting device to drive the electrodes in a time division manner and to detect detection values corresponding to electrostatic capacitances between the to-be-detected object and the respective electrodes; and causing a position detector in the electrostatic-capacitive proximity detecting device to detect a position of the to-be-detected object in the direction, based on arrangement positions of the respective electrodes in the direction and a bias in magnitudes of the detection values detected for the respective electrodes by the electrostatic capacitance detector;

wherein the position detector determines whether or not the correspondence value is in a certain range, and when the correspondence value is in the certain range, the position detector determines that the to-be-detected object is located in a certain region in the direction;

wherein the position detector further:
recognizes a degree of an amount of spacing between the electrode unit and the to-be-detected object, and
adjusts the correspondence value by reflecting a degree of an amount of displacement between an electrode-group center position that is a position of, in the direction, a center portion of a region where the electrodes in the electrode unit are arranged and a position indicated by the correspondence value, and during the adjustment of the correspondence value, the position detector more strongly reflects the degree of the amount of displacement as the amount of spacing becomes larger; and wherein the position detector adjusts the correspondence value by adding a value, derived by multiplying a value obtained by subtracting a value indicating the electrode-group center position from the correspondence value by a coefficient, to the correspondence value, and during the adjustment of the correspondence value, the position detector increases the coefficient as the amount of spacing increases.

* * * * *